US011466364B2

(12) United States Patent
Ohno et al.

(10) Patent No.: US 11,466,364 B2
(45) Date of Patent: Oct. 11, 2022

(54) METHODS FOR FORMING PROTECTIVE COATINGS CONTAINING CRYSTALLIZED ALUMINUM OXIDE

(71) Applicant: Applied Materials, Inc., Santa Clara, CA (US)

(72) Inventors: Kenichi Ohno, Sunnyvale, CA (US); Eric H. Liu, Los Altos, CA (US); Sukti Chatterjee, San Jose, CA (US); Yuriy Melnik, San Jose, CA (US); Thomas Knisley, Livonia, MI (US); David Alexander Britz, San Jose, CA (US); Lance A. Scudder, Sunnyvale, CA (US); Pravin K. Narwankar, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 343 days.

(21) Appl. No.: 16/670,555

(22) Filed: Oct. 31, 2019

(65) Prior Publication Data

US 2021/0071299 A1    Mar. 11, 2021

Related U.S. Application Data

(60) Provisional application No. 62/897,037, filed on Sep. 6, 2019.

(51) Int. Cl.
*C23C 16/455*    (2006.01)
*C23C 16/02*    (2006.01)
(Continued)

(52) U.S. Cl.
CPC .... *C23C 16/45527* (2013.01); *C23C 16/0209* (2013.01); *C23C 16/403* (2013.01); *C23C 16/405* (2013.01); *C23C 16/56* (2013.01)

(58) Field of Classification Search
None
See application file for complete search history.

(56) References Cited

U.S. PATENT DOCUMENTS 4,698,130 A    10/1987  Restall et al.
5,071,678 A    12/1991  Grybowski et al.
(Continued)

FOREIGN PATENT DOCUMENTS

CN    104647828    *    5/2015    ............. B23B 15/04
EP    0209307 A1        1/1987
(Continued)

OTHER PUBLICATIONS

Wang et al. "Hydrogen permeation properties of CrxCy@Cr2O3/Al2O3 composite coating derived from selective oxidation of a Cr—C alloy and atomic layer deposition" Int. Journal of Hydrogen energy 43 2018 p. 21133-21141 (Year: 2018).*

(Continued)

*Primary Examiner* — Mandy C Louie
(74) *Attorney, Agent, or Firm* — Patterson + Sheridan, LLP

(57) ABSTRACT

Embodiments of the present disclosure generally relate to protective coatings on substrates and methods for depositing the protective coatings. In one or more embodiments, a method of forming a protective coating on a substrate includes depositing a chromium oxide layer containing amorphous chromium oxide on a surface of the substrate during a first vapor deposition process and heating the substrate containing the chromium oxide layer comprising the amorphous chromium oxide to convert at least a portion of the amorphous chromium oxide to crystalline chromium oxide during a first annealing process. The method also includes depositing an aluminum oxide layer containing amorphous aluminum oxide on the chromium oxide layer during a second vapor deposition process and heating the (Continued)

substrate containing the aluminum oxide layer disposed on the chromium oxide layer to convert at least a portion of the amorphous aluminum oxide to crystalline aluminum oxide during a second annealing process.

21 Claims, 4 Drawing Sheets

(51) Int. Cl.
    *C23C 16/56*           (2006.01)
    *C23C 16/40*           (2006.01)

(56) References Cited

U.S. PATENT DOCUMENTS

| | | | |
|---|---|---|---|
| 5,217,757 A | 6/1993 | Olson et al. |
| 5,362,228 A | 11/1994 | Vaudel |
| 5,494,704 A | 2/1996 | Ackerman |
| 5,503,874 A | 4/1996 | Ackerman et al. |
| 5,950,925 A | 9/1999 | Fukunaga et al. |
| 6,042,898 A | 3/2000 | Burns et al. |
| 6,156,382 A | 12/2000 | Rajagopalan et al. |
| 6,162,715 A | 12/2000 | Mak et al. |
| 6,180,170 B1 | 1/2001 | Grossmann et al. |
| 6,203,851 B1 | 3/2001 | Walter |
| 6,224,941 B1 | 5/2001 | Chen et al. |
| 6,245,192 B1 | 6/2001 | Dhindsa et al. |
| 6,273,678 B1 | 8/2001 | Darolia |
| 6,309,713 B1 | 10/2001 | Mak et al. |
| 6,332,926 B1 | 12/2001 | Pfaendtner et al. |
| 6,359,089 B2 | 3/2002 | Hung et al. |
| 6,379,466 B1 | 4/2002 | Sahin et al. |
| 6,402,898 B1 | 6/2002 | Brumer et al. |
| 6,413,584 B1 | 7/2002 | Wustman et al. |
| 6,434,876 B1 | 8/2002 | Wheat et al. |
| 6,437,066 B1 | 8/2002 | Hung et al. |
| 6,465,040 B2 | 10/2002 | Gupta et al. |
| 6,485,262 B1 | 11/2002 | Heyward et al. |
| 6,495,271 B1 | 12/2002 | Vakil |
| 6,551,929 B1 | 4/2003 | Kori et al. |
| 6,589,668 B1 | 7/2003 | Braithwaite et al. |
| 6,607,976 B2 | 8/2003 | Chen et al. |
| 6,620,670 B2 | 9/2003 | Song et al. |
| 6,620,723 B1 | 9/2003 | Byun et al. |
| 6,620,956 B2 | 9/2003 | Chen et al. |
| 6,630,244 B1 | 10/2003 | Mao et al. |
| 6,677,247 B2 | 1/2004 | Yuan et al. |
| 6,740,585 B2 | 5/2004 | Yoon et al. |
| 6,784,096 B2 | 8/2004 | Chen et al. |
| 6,797,340 B2 | 9/2004 | Fang et al. |
| 6,800,376 B1 | 10/2004 | Gupta et al. |
| 6,805,750 B1 | 10/2004 | Ristau et al. |
| 6,809,026 B2 | 10/2004 | Yoon et al. |
| 6,811,814 B2 | 11/2004 | Chen et al. |
| 6,821,891 B2 | 11/2004 | Chen et al. |
| 6,825,134 B2 | 11/2004 | Law et al. |
| 6,827,978 B2 | 12/2004 | Yoon et al. |
| 6,831,021 B2 | 12/2004 | Chua et al. |
| 6,833,161 B2 | 12/2004 | Wang et al. |
| 6,838,125 B2 | 1/2005 | Chung et al. |
| 6,846,516 B2 | 1/2005 | Yang et al. |
| 6,869,838 B2 | 3/2005 | Law et al. |
| 6,872,429 B1 | 3/2005 | Chen et al. |
| 6,905,730 B2 | 6/2005 | Ackerman et al. |
| 6,905,939 B2 | 6/2005 | Yuan et al. |
| 6,911,391 B2 | 6/2005 | Yang et al. |
| 6,924,191 B2 | 8/2005 | Liu et al. |
| 6,936,538 B2 | 8/2005 | Byun |
| 6,939,801 B2 | 9/2005 | Chung et al. |
| 6,939,804 B2 | 9/2005 | Lai et al. |
| 6,949,342 B2 | 9/2005 | Golub et al. |
| 6,951,804 B2 | 10/2005 | Seutter et al. |
| 6,972,267 B2 | 12/2005 | Cao et al. |
| 7,011,947 B2 | 3/2006 | Golub et al. |
| 7,026,238 B2 | 4/2006 | Xi et al. |
| 7,041,335 B2 | 5/2006 | Chung |
| 7,049,226 B2 | 5/2006 | Chung et al. |
| 7,081,271 B2 | 7/2006 | Chung et al. |
| 7,101,795 B1 | 9/2006 | Xi et al. |
| 7,211,144 B2 | 5/2007 | Lu et al. |
| 7,211,508 B2 | 5/2007 | Chung et al. |
| 7,241,686 B2 | 7/2007 | Marcadal et al. |
| 7,244,683 B2 | 7/2007 | Chung et al. |
| 7,262,133 B2 | 8/2007 | Chen et al. |
| 7,264,846 B2 | 9/2007 | Chang et al. |
| 7,265,048 B2 | 9/2007 | Chung et al. |
| 7,279,432 B2 | 10/2007 | Xi et al. |
| 7,285,312 B2 | 10/2007 | Li |
| 7,317,229 B2 | 1/2008 | Hung et al. |
| 7,371,467 B2 | 5/2008 | Han et al. |
| 7,396,565 B2 | 7/2008 | Yang et al. |
| 7,404,985 B2 | 7/2008 | Chang et al. |
| 7,405,158 B2 | 7/2008 | Lai et al. |
| 7,416,979 B2 | 8/2008 | Yoon et al. |
| 7,429,402 B2 | 9/2008 | Gandikota et al. |
| 7,429,540 B2 | 9/2008 | Olsen |
| 7,439,191 B2 | 10/2008 | Law et al. |
| 7,473,655 B2 | 1/2009 | Wang et al. |
| 7,501,248 B2 | 3/2009 | Golub et al. |
| 7,507,660 B2 | 3/2009 | Chen et al. |
| 7,531,468 B2 | 5/2009 | Metzner et al. |
| 7,547,952 B2 | 6/2009 | Metzner et al. |
| 7,569,501 B2 | 8/2009 | Metzner et al. |
| 7,573,586 B1 | 8/2009 | Boyer et al. |
| 7,585,762 B2 | 9/2009 | Shah et al. |
| 7,595,263 B2 | 9/2009 | Chung et al. |
| 7,601,652 B2 | 10/2009 | Singh et al. |
| 7,651,955 B2 | 1/2010 | Ranish et al. |
| 7,732,327 B2 | 6/2010 | Lee et al. |
| 7,737,028 B2 | 6/2010 | Wang et al. |
| 7,776,395 B2 | 8/2010 | Mahajani |
| 7,816,200 B2 | 10/2010 | Kher |
| 7,824,743 B2 | 11/2010 | Lee et al. |
| 7,833,358 B2 | 11/2010 | Chu et al. |
| 7,846,840 B2 | 12/2010 | Kori et al. |
| 7,867,900 B2 | 1/2011 | Lee et al. |
| 7,875,119 B2 | 1/2011 | Gartland et al. |
| 7,910,165 B2 | 3/2011 | Ganguli et al. |
| 7,910,231 B2 | 3/2011 | Schuh et al. |
| 7,910,446 B2 | 3/2011 | Ma et al. |
| 7,964,505 B2 | 6/2011 | Khandelwal et al. |
| 7,972,978 B2 | 7/2011 | Mahajani |
| 3,043,907 A1 | 10/2011 | Ma et al. |
| 3,056,652 A1 | 11/2011 | Lockwood et al. |
| 8,227,078 B2 | 7/2012 | Morra et al. |
| 8,277,670 B2 | 10/2012 | Heo et al. |
| 8,470,460 B2 | 6/2013 | Lee |
| 8,721,812 B2 | 5/2014 | Furrer et al. |
| 8,741,420 B2 | 6/2014 | Bunker et al. |
| 8,871,297 B2 | 10/2014 | Barnett et al. |
| 9,255,327 B2 | 2/2016 | Winter et al. |
| 9,347,145 B2 | 5/2016 | Bessho |
| 9,476,119 B2 | 10/2016 | Atwal et al. |
| 9,683,281 B2 | 6/2017 | Meehan et al. |
| 9,777,583 B2 | 10/2017 | Leggett |
| 9,873,940 B2 | 1/2018 | Xu et al. |
| 10,072,335 B2 | 9/2018 | Marquardt et al. |
| 10,287,899 B2 | 5/2019 | Dierberger |
| 10,369,593 B2 | 8/2019 | Barnett et al. |
| 10,443,142 B2 | 10/2019 | Miettinen et al. |
| 10,488,332 B2 | 11/2019 | Kessler et al. |
| 10,633,740 B2 | 4/2020 | Melnik et al. |
| 11,028,480 B2 | 6/2021 | Knisley et al. |
| 2002/0002258 A1 | 1/2002 | Hung et al. |
| 2002/0045782 A1 | 4/2002 | Hung et al. |
| 2002/0117399 A1 | 8/2002 | Chen et al. |
| 2002/0127336 A1 | 9/2002 | Chen et al. |
| 2002/0136824 A1 | 9/2002 | Gupta et al. |
| 2003/0010451 A1 | 1/2003 | Tzu et al. |
| 2003/0057526 A1 | 3/2003 | Chung et al. |
| 2003/0059535 A1 | 3/2003 | Luo et al. |
| 2003/0059538 A1 | 3/2003 | Chung et al. |
| 2003/0072884 A1 | 4/2003 | Zhang et al. |
| 2003/0082301 A1 | 5/2003 | Chen et al. |

(56) References Cited

U.S. PATENT DOCUMENTS

| | | |
|---|---|---|
| 2003/0123216 A1 | 7/2003 | Yoon et al. |
| 2003/0124262 A1 | 7/2003 | Chen et al. |
| 2003/0132319 A1 | 7/2003 | Hytros et al. |
| 2003/0134300 A1 | 7/2003 | Golub et al. |
| 2003/0136520 A1 | 7/2003 | Yudovsky et al. |
| 2003/0139005 A1 | 7/2003 | Song et al. |
| 2003/0145875 A1 | 8/2003 | Han et al. |
| 2003/0152980 A1 | 8/2003 | Golub et al. |
| 2003/0157760 A1 | 8/2003 | Xi et al. |
| 2003/0172872 A1 | 9/2003 | Thakur et al. |
| 2003/0198754 A1 | 10/2003 | Xi et al. |
| 2003/0203616 A1 | 10/2003 | Chung et al. |
| 2003/0215570 A1 | 11/2003 | Seutter et al. |
| 2003/0235961 A1 | 12/2003 | Metzner et al. |
| 2004/0009665 A1 | 1/2004 | Chen et al. |
| 2004/0013803 A1 | 1/2004 | Chung et al. |
| 2004/0018738 A1 | 1/2004 | Liu |
| 2004/0079648 A1 | 4/2004 | Khan et al. |
| 2004/0161628 A1 | 8/2004 | Gupta et al. |
| 2004/0171280 A1 | 9/2004 | Conley et al. |
| 2005/0003310 A1 | 1/2005 | Bai et al. |
| 2005/0008780 A1 | 1/2005 | Ackerman et al. |
| 2005/0019593 A1 | 1/2005 | Mancini et al. |
| 2005/0053467 A1 | 3/2005 | Ackerman et al. |
| 2005/0085031 A1 | 4/2005 | Lopatin et al. |
| 2005/0126593 A1 | 6/2005 | Budinger et al. |
| 2005/0158590 A1 | 7/2005 | Li |
| 2005/0255329 A1 | 11/2005 | Hazel |
| 2005/0260347 A1 | 11/2005 | Narwankar et al. |
| 2005/0260357 A1 | 11/2005 | Olsen et al. |
| 2005/0271813 A1 | 12/2005 | Kher et al. |
| 2006/0008838 A1 | 1/2006 | Golub et al. |
| 2006/0019032 A1 | 1/2006 | Wang et al. |
| 2006/0019033 A1 | 1/2006 | Muthukrishnan et al. |
| 2006/0021633 A1 | 2/2006 | Harvey |
| 2006/0024734 A1 | 2/2006 | Golub et al. |
| 2006/0029971 A1 | 2/2006 | Golub et al. |
| 2006/0040052 A1 | 2/2006 | Fang et al. |
| 2006/0057630 A1 | 3/2006 | Golub et al. |
| 2006/0062917 A1 | 3/2006 | Muthukrishnan et al. |
| 2006/0084283 A1 | 4/2006 | Paranjpe et al. |
| 2006/0141283 A1 | 6/2006 | Madhava |
| 2006/0148180 A1 | 7/2006 | Ahn et al. |
| 2006/0153995 A1 | 7/2006 | Narwankar et al. |
| 2006/0228895 A1 | 10/2006 | Chae et al. |
| 2006/0246213 A1 | 11/2006 | Moreau et al. |
| 2006/0286819 A1 | 12/2006 | Seutter et al. |
| 2007/0009658 A1 | 1/2007 | Yoo et al. |
| 2007/0009660 A1 | 1/2007 | Sasaki et al. |
| 2007/0023142 A1 | 2/2007 | LaGraff et al. |
| 2007/0049043 A1 | 3/2007 | Muthukrishnan et al. |
| 2007/0054487 A1 | 3/2007 | Ma et al. |
| 2007/0065578 A1 | 3/2007 | McDougall |
| 2007/0099415 A1 | 5/2007 | Chen et al. |
| 2007/0134518 A1 | 6/2007 | Feist et al. |
| 2007/0202254 A1 | 8/2007 | Ganguli et al. |
| 2007/0259111 A1 | 11/2007 | Singh et al. |
| 2007/0274837 A1 | 11/2007 | Taylor et al. |
| 2008/0032510 A1 | 2/2008 | Olsen |
| 2008/0038578 A1 | 2/2008 | Li |
| 2008/0056905 A1 | 3/2008 | Golecki |
| 2008/0057193 A1 | 3/2008 | Mantkowski |
| 2008/0090425 A9 | 4/2008 | Olsen |
| 2008/0113095 A1 | 5/2008 | Gorman et al. |
| 2008/0135914 A1 | 6/2008 | Krishna et al. |
| 2008/0268154 A1 | 10/2008 | Kher et al. |
| 2008/0268635 A1 | 10/2008 | Yu et al. |
| 2009/0004386 A1 | 1/2009 | Makela et al. |
| 2009/0004850 A1 | 1/2009 | Ganguli et al. |
| 2009/0053426 A1 | 2/2009 | Lu et al. |
| 2009/0061613 A1 | 3/2009 | Choi et al. |
| 2009/0098289 A1 | 4/2009 | Deininger et al. |
| 2009/0098346 A1 | 4/2009 | Li |
| 2009/0155976 A1 | 6/2009 | Ahn et al. |
| 2009/0239061 A1 | 9/2009 | Hazel et al. |
| 2009/0269507 A1 | 10/2009 | Yu et al. |
| 2009/0286400 A1 | 11/2009 | Heo et al. |
| 2010/0062149 A1 | 3/2010 | Ma et al. |
| 2010/0062614 A1 | 3/2010 | Ma et al. |
| 2010/0075499 A1 | 3/2010 | Olsen |
| 2010/0110451 A1 | 5/2010 | Biswas et al. |
| 2010/0120245 A1 | 5/2010 | Tjandra et al. |
| 2010/0159150 A1 | 6/2010 | Kirby et al. |
| 2010/0167527 A1 | 7/2010 | Wu et al. |
| 2010/0239758 A1 | 9/2010 | Kher et al. |
| 2010/0252151 A1* | 10/2010 | Furrer ................ C22F 1/10 148/714 |
| 2010/0270609 A1 | 10/2010 | Olsen et al. |
| 2010/0279018 A1 | 11/2010 | Hazel et al. |
| 2011/0175038 A1 | 7/2011 | Hou et al. |
| 2011/0293825 A1 | 12/2011 | Atwal et al. |
| 2012/0024403 A1 | 2/2012 | Gage et al. |
| 2012/0040084 A1 | 2/2012 | Fairbourn |
| 2012/0082783 A1 | 4/2012 | Barnett et al. |
| 2012/0148944 A1 | 6/2012 | Oh et al. |
| 2012/0276306 A1 | 11/2012 | Ueda |
| 2012/0318773 A1 | 12/2012 | Wu et al. |
| 2013/0048605 A1 | 2/2013 | Sapre et al. |
| 2013/0164456 A1 | 6/2013 | Winter et al. |
| 2013/0292655 A1 | 11/2013 | Becker et al. |
| 2014/0103284 A1 | 4/2014 | Hsueh et al. |
| 2014/0264297 A1 | 9/2014 | Kumar et al. |
| 2014/0271220 A1 | 9/2014 | Leggett |
| 2015/0017324 A1 | 1/2015 | Barnett et al. |
| 2015/0184296 A1 | 7/2015 | Xu et al. |
| 2015/0221541 A1 | 8/2015 | Nemani et al. |
| 2016/0010472 A1 | 1/2016 | Murphy et al. |
| 2016/0060758 A1* | 3/2016 | Marquardt ........ C23C 16/45553 428/216 |
| 2016/0181627 A1 | 6/2016 | Roeder et al. |
| 2016/0251972 A1 | 9/2016 | Dierberger |
| 2016/0281230 A1 | 9/2016 | Varadarajan et al. |
| 2016/0298222 A1 | 10/2016 | Meehan et al. |
| 2016/0300709 A1 | 10/2016 | Posseme et al. |
| 2016/0328635 A1 | 11/2016 | Dave et al. |
| 2016/0333493 A1* | 11/2016 | Miettinen ............. C23C 18/32 |
| 2016/0333494 A1 | 11/2016 | Miettinen et al. |
| 2017/0076968 A1 | 3/2017 | Wang et al. |
| 2017/0084425 A1 | 3/2017 | Uziel et al. |
| 2017/0158978 A1 | 6/2017 | Montagne et al. |
| 2017/0159198 A1 | 6/2017 | Miettinen et al. |
| 2017/0213570 A1 | 7/2017 | Cheng et al. |
| 2017/0233930 A1 | 8/2017 | Keuleers et al. |
| 2017/0292445 A1 | 10/2017 | Nelson et al. |
| 2017/0314125 A1 | 11/2017 | Fenwick et al. |
| 2018/0006215 A1 | 1/2018 | Jeong et al. |
| 2018/0105932 A1 | 4/2018 | Fenwick et al. |
| 2018/0127868 A1 | 5/2018 | Xu et al. |
| 2018/0156725 A1 | 6/2018 | Kessler et al. |
| 2018/0261516 A1 | 9/2018 | Lin et al. |
| 2018/0261686 A1 | 9/2018 | Lin et al. |
| 2018/0329189 A1 | 11/2018 | Banna et al. |
| 2018/0339314 A1 | 11/2018 | Bhoyar et al. |
| 2018/0351164 A1 | 12/2018 | Hellmich et al. |
| 2018/0358229 A1 | 12/2018 | Koshizawa et al. |
| 2019/0019690 A1 | 1/2019 | Choi et al. |
| 2019/0032194 A2 | 1/2019 | Dieguez-Campo et al. |
| 2019/0079388 A1 | 3/2019 | Fender et al. |
| 2019/0088543 A1 | 3/2019 | Lin et al. |
| 2019/0130731 A1 | 5/2019 | Hassan et al. |
| 2019/0271076 A1 | 9/2019 | Fenwick et al. |
| 2019/0274692 A1 | 9/2019 | Lampropoulos et al. |
| 2019/0284686 A1 | 9/2019 | Melnik et al. |
| 2019/0284692 A1 | 9/2019 | Melnik et al. |
| 2019/0284693 A1* | 9/2019 | Task .................. C23C 16/45555 |
| 2019/0284694 A1 | 9/2019 | Knisley et al. |
| 2019/0287808 A1 | 9/2019 | Goradia et al. |
| 2019/0311900 A1 | 10/2019 | Pandit et al. |
| 2019/0311909 A1 | 10/2019 | Bajaj et al. |
| 2019/0330746 A1 | 10/2019 | Britz et al. |
| 2019/0382879 A1 | 12/2019 | Jindal et al. |
| 2020/0027767 A1 | 1/2020 | Zang et al. |
| 2020/0043722 A1 | 2/2020 | Cheng et al. |
| 2020/0240018 A1 | 7/2020 | Melnik et al. |

(56) References Cited

U.S. PATENT DOCUMENTS

| | | | |
|---|---|---|---|
| 2020/0361124 | A1 | 11/2020 | Britz |
| 2020/0392626 | A1 | 12/2020 | Chatterjee et al. |
| 2021/0292901 | A1 | 9/2021 | Knisley et al. |

FOREIGN PATENT DOCUMENTS

| | | | |
|---|---|---|---|
| EP | 0387113 B1 | 12/1993 | |
| EP | 1431372 A2 | 6/2004 | |
| EP | 1236812 B1 | 5/2006 | |
| EP | 2022868 A2 | 2/2009 | |
| EP | 2103707 A1 | 9/2009 | |
| EP | 2194164 A1 | 6/2010 | |
| EP | 2392895 A1 | 12/2011 | |
| EP | 2161352 B1 | 2/2014 | |
| JP | 2823086 B2 | 11/1998 | |
| JP | 2001342556 A | 12/2001 | |
| JP | 2003013745 A | 1/2003 | |
| JP | 2003164819 A | 6/2003 | |
| JP | 2006010403 A | 1/2006 | |
| JP | 2006199988 A | 8/2006 | |
| KR | 20060106104 A | 10/2006 | |
| KR | 20110014989 A | 2/2011 | |
| KR | 101192248 B1 | 10/2012 | |
| KR | 20170063149 A | 6/2017 | |
| KR | 101761736 B1 | 7/2017 | |
| KR | 20170140354 A | 12/2017 | |
| RU | 2630733 C2 | 9/2017 | |
| TW | 201812075 A | 4/2018 | |
| WO | 9631687 A1 | 10/1996 | |
| WO | 00/09778 A1 | 2/2000 | |
| WO | 2005059200 A1 | 6/2005 | |
| WO | 2014159267 A1 | 10/2014 | |
| WO | 2015047783 A1 | 4/2015 | |
| WO | 2019182967 A1 | 9/2019 | |

OTHER PUBLICATIONS

Liu "Microstructural evolution of the interface between NiCrAly coating and superalloy during isothermal oxidation" Mat. and Des 80 (2015) p. 63-69 (Year: 2015).*
International Search Report and the Written Opinion for International Application No. PCT/US2020/028462 dated Jul. 29, 2020, 11 pages.
International Search Report and Written Report dated Jul. 31, 2020 for Application No. PCT/US2020/027247.
W. Auwarter, "Hexagonal boron nitride monolayers on metal supports: Versatile templates for atoms, molecules and nanostructures", Surface Science Reports 74 (2019) 1-95.
Calderon, "Boron Nitride Growth and Electronics", Cornell University, May 2018.
Liu et al., "Ultrathin high-temperature oxidation-resistant coatings of hexagonal boron nitride" Nature Communications; doi: 10.1038/ncomms3541; Pub. Oct. 4, 2013, 8 pages.
PCT Notification of Transmittal of the International Search Report and the Written Opinion of the International Searching Authority for International Application No. PCT/US2019/019113; dated Jun. 10, 2019; 11 total pages.
Taiwan Office Action dated Apr. 22, 2020 for Application No. 108106406.
PCT International Search Report and the Written Opinion for International Application No. PCT/US2019/041181; dated Oct. 25, 2019; 15 total pages.
International Search Report and Written Opinion dated Jun. 24, 2020 for Application No. PCT/US2020/019151.
Leppaniemi, Jarmo, et al., "Corrosion protection of steel with multilayer coatings: Improving the sealing properties of physical vapor deposition CrN coatings with Al2O3/TiO2 atomic layer deposition nanolaminates". Thin Solid Films 627 (2017) pp. 59-68.
Ali, Muhammad Rostom, et al., "Electrodeposition of aluminum-chromium alloys from Al&BPC melt and its corrosion and high temperature oxidation behaviors." Electrochimica Acta, vol. 42. No 15., pp. 2347-2354, 1997.
Wu, Yanlin, et al., "Atomic Layer Deposition from Dissolved Precursors". Nano Letters 2015, 15, 6379-6385.
Johnson, Andrew L., et al., "Recent developments in molecular precursors for atomic layer deposition". Organomet. Chem., 2019, 42, 1-53.
Haukka, Suvi, et al., "Chemisorption of chromium acetylacetonate on porous high surface area silica". Applied Surface Science, vol. 75, Issues 1-4, Jan. 2, 1994, pp. 220-227. Abstract Only.
International Search Report and Written Opinion dated Oct. 30, 2020 for Application No. PCT/US2020/041382.
Fujita et al. "Sintering of Al2O3—Cr2O3 Powder Prepared by Sol-Gel Process," Journal of the Society of Materials Science, Japan, vol. 56, No. 6, Jun. 2007, pp. 526-530, <http://www.ecm.okayama-u.ac.jp/ceramics/Research/Papers/2007/Fujita_JSMS56(2007)526.pdf>.
Hirata et al. "Corrosion Resistance of Alumina-Chromia Ceramic Materials against Molten Slag," Materials Transactions, vol. 43, No. 10, 2002, pp. 2561-2567, <https://www.jim.or.jp/journal/e/pdf3/43/10/2561.pdf>.
Bensch et al. "Modeling of the Influence of Oxidation of Thin-Walled Specimens of Single Crystal Superalloys," Superalloys 2012: 12th International Symposium on Superalloys, The Minerals, Metals & Materials Society, pp. 331-340, <https://www.tms.org/superalloys/10.7449/2012/Superalloys_2012_331_340.pdf>.
He et al. "Role of annealing temperatures on the evolution of microstructure and properties of Cr2O3 films," Applied Surface Science, vol. 357, Part B, Dec. 1, 2015, pp. 1472-1480, <https://doi.org/10.1016/j.apsusc.2015.10.023>.
Kaloyeros et al. "Review-Silicon Nitrtide and Silicon Nitride-Rich Thin Film Technologies: Trends in Deposition Technniques and Related Application". ECS Journal of Solid State Science and Technology, 6 (10) p. 691-p. 714 (2017).
Heidary et al. "Study on the behavior of atomic layer deposition coatings on a nickel substrate at high temperature," Nanotechnology, 27, 245701, 2016, pp. 1-32.
Vargas Garcia et al. "Thermal barrier coatings produced by chemical vapor deposition," Science and Technology of Advanced Materials, vol. 4, No. 4, 2003, pp. 397-402.
Dyer et al. "CVD Tungsten Carbide and Titanium Carbide Coatings for Aerospace Components," SAE Transactions, vol. 98, Section 1: Journal of Aerospace (1989), pp. 64-70. Abstract Only.
International Search Report and Written Opinion dated Jul. 6, 2020 for Application No. PCT/US2020/024285.
Taiwan Office Action dated Dec. 21, 2020 for Application No. 109113600.
International Search Report and Written Opinion dated Feb. 2, 2021 for Application No. PCT/US2020/056618.
Taiwan Office Action dated May 10, 2021 for Application No. 109126499.
Growth mechanism of Cr2O3 scales: oxygen diffusion and chromium, oxidation kinetics and effect of yttrium, Materials Science and Engineering A212 (1996) 6-13.
The Role of Active Elements in the Oxidation Behaviour of HighTemperature Metals and Alloys, E. Lang, Dec. 6, 2012 (pp. 111-129 and 153).
Volatility and High Thermal Stability in Mid to Late First Row Transition Metal Diazadienyl Complexes; Organometallics 2011, 30, 5010-5017.
A Review on Alumina-Chrome (Al2O3—Cr2O3) and Chrome-Silica (Cr2O3—SiO2) Refractories Along With Their Binary Phase Diagrams; http://www.idc-online.com/technical_references/pdfs/chemical_engineering/A_Review_on_Alumina_Chrome.pdf.
Oxidation and Hot Corrosion of Superalloys; http://www.tms.org/superalloys/10.7449/1984/Superalloys_1984_651_687.pdf.
International Search Report and Written Opinion dated Jul. 2, 2019 for Application No. PCT/US2019/022788.
International Search Report and Writtne Opinion dated Jul. 2, 2019 for Application No. PCT/US2019/022737.
International Search Report and Written Opinion dated Jun. 28, 2019 for Application No. PCT/US2019/022709.
European Search Report dated Jul. 26, 2021 for Application No. 19793402.9.

(56) References Cited

OTHER PUBLICATIONS

International Search Report and Written Opinion dated Sep. 28, 2021 for Application No. PCT/US2021/035874.
Extended European Search Report dated Oct. 4, 2021 for Application No. 19793402.9.
Extended European Search Report dated Nov. 15, 2021 for Application No. EP 19772037.8.
Taiwan Office Action dated Oct. 7, 2021 for Application No. 109126499.
International Search Report and Written Opinion dated Dec. 2, 2021 for Application No. PCT/US2021/045766.
International Search Report dated Dec. 1, 2021 for Application No. PCT/US2021/046245.

* cited by examiner

METHODS FOR FORMING PROTECTIVE COATINGS CONTAINING CRYSTALLIZED ALUMINUM OXIDE

CROSS-REFERENCE TO RELATED APPLICATIONS

This application claims benefit to U.S. Appl. No. 62/897,037, filed on Sep. 6, 2019, which is herein incorporated by reference.

BACKGROUND

Field

Embodiments of the present disclosure generally relate to deposition processes, and in particular to vapor deposition processes for depositing films on various types of substrates including aerospace components.

Description of the Related Art

Turbine engines typically have components which corrode or degrade over time due to being exposed to hot gases and/or reactive chemicals (e.g., acids, bases, or salts). Such turbine components are often protected by a thermal and/or chemical barrier coating. The current coatings used on airfoils exposed to the hot gases of combustion in gas turbine engines for both environmental protection and as bond coats in thermal barrier coating (TBC) systems include both diffusion aluminides and various metal alloy coatings. These coatings are applied over substrate materials, typically nickel-based superalloys, to provide protection against oxidation and corrosion attack. These coatings are formed on the substrate in a number of different ways. For example, a nickel aluminide layer may be grown as an outer coat on a nickel base superalloy by simply exposing the substrate to an aluminum rich environment at elevated temperatures. The aluminum diffuses into the substrate and combines with the nickel to form an outer surface of the nickel-aluminum alloy.

However, as the increased demands for engine performance elevate the engine operating temperatures and/or the engine life requirements, improvements in the performance of coatings when used as environmental coatings or as bond coatings are needed over and above the capabilities of these existing coatings. Because of these demands, a coating that can be used for environmental protection or as a bond coat capable of withstanding higher operating temperatures or operating for a longer period of time before requiring removal for repair, or both, is desired. These known coating materials and deposition techniques have several shortcomings. Most metal alloy coatings deposited by low pressure plasma spray, plasma vapor deposition (PVD), electron beam PVD (EBPVD), cathodic arc, or similar sputtering techniques are line of sight coatings, meaning that interiors of components are not able to be coated. Platinum electroplating of exteriors typically forms a reasonably uniform coating, however, electroplating the interior of a component has proven to be challenging. The resulting electroplating coatings are often too thin to be protective or too thick that there are other adverse mechanical effects, such as high weight gain or fatigue life debit. Similarly, aluminide coatings suffer from non-uniformity on interior passages of components. Aluminide coatings are brittle, which can lead to reduced life when exposed to fatigue.

In addition, most of these coatings are on the order of greater than 10 micrometers in thickness, which can cause component weight to increase, making design of the disks and other support structures more challenging. Many of these coatings also require high temperature (e.g., greater than 500° C.) steps to deposit or promote enough interdiffusion of the coating into the alloy to achieve adhesion. It is desired by many to have coatings that (1) protect metals from oxidation and corrosion, (2) are capable of high film thickness and composition uniformity on arbitrary geometries, (3) have high adhesion to the metal, (4) are sufficiently thin to not materially increase weight or reduce fatigue life outside of current design practices for bare metal, and/or (5) are deposited at sufficiently low temperature (e.g., 500° C. or less) to not cause microstructural changes to the metal.

Therefore, improved protective coatings and methods for depositing the protective coatings are needed.

SUMMARY

Embodiments of the present disclosure generally relate to protective coatings on substrates including aerospace components and methods for depositing the protective coatings. In one or more embodiments, a method of forming a protective coating on a substrate includes exposing the substrate to a chromium precursor and a first oxidizing agent to form a chromium oxide layer containing amorphous chromium oxide on a surface of the substrate during a first atomic layer deposition (ALD) process or a first chemical vapor deposition (CVD) process, and heating the substrate containing the chromium oxide layer containing the amorphous chromium oxide to convert at least a portion of the amorphous chromium oxide to crystalline chromium oxide during a first annealing process. The method also includes exposing the substrate to an aluminum precursor and a second oxidizing agent to form an aluminum oxide layer containing amorphous aluminum oxide on the chromium oxide layer during a second ALD process or a second CVD process, and heating the substrate containing the aluminum oxide layer disposed on the chromium oxide layer to convert at least a portion of the amorphous aluminum oxide to crystalline aluminum oxide during a second annealing process.

In some embodiments, a method of forming a protective coating on a substrate includes exposing the substrate to a chromium precursor and a first oxidizing agent to form a chromium oxide layer on a surface of the substrate during a first ALD process or a first CVD process, exposing the substrate to an aluminum precursor and a second oxidizing agent to form an aluminum oxide layer containing amorphous aluminum oxide on the chromium oxide layer during a second ALD process or a second CVD process, and heating the substrate containing the aluminum oxide layer disposed on the chromium oxide layer to convert the amorphous aluminum oxide to crystalline aluminum oxide.

In other embodiments, a method of forming a protective coating on a substrate includes depositing a chromium oxide layer containing amorphous chromium oxide on a surface of the substrate during a first ALD process or a first CVD process, where the substrate contains a nickel-aluminum alloy, and depositing an upper aluminum oxide layer containing amorphous aluminum oxide on the chromium oxide layer during a second ALD process or a second CVD process. The method also includes heating the substrate containing the upper aluminum oxide layer disposed on the chromium oxide layer to diffuse aluminum from the nickel-aluminum alloy in the substrate to an interface between the substrate and the chromium oxide layer during a first annealing process, where the interface has a greater concentration of aluminum after the first annealing process than before the first annealing process. The method also includes heating the substrate containing the upper aluminum oxide layer disposed on the chromium oxide layer during a second annealing process. The second annealing process includes converting the aluminum in the interface between the substrate and the chromium oxide layer to a lower aluminum oxide layer containing crystalline aluminum oxide, converting at least a portion of the amorphous chromium oxide in the chromium oxide layer to crystalline chromium oxide, and converting at least a portion of the amorphous aluminum oxide in the upper aluminum oxide layer to crystalline aluminum oxide.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the Figures. It is contemplated that elements and features of one or more embodiments may be beneficially incorporated in other embodiments.

DETAILED DESCRIPTION

Embodiments of the present disclosure generally relate to protective coatings, such as nanolaminate film stacks containing a chromium oxide layer and an aluminum oxide layer, disposed on one or more substrates and methods for depositing the protective coatings. The chromium oxide layer can contain crystalline chromium oxide which acts a crystallization template to help grow or produce crystalline aluminum oxide in the aluminum oxide layer. The crystalline aluminum oxide ($\alpha$-$Al_2O_3$) has a crystalline polymorphic phase and provides greater level of performance for oxidation resistance and corrosion resistance over non-crystalline or amorphous aluminum oxide.

The substrate can be or include any type of substrate or wafer, such as, a silicon substrate, a silicon oxide or quartz substrate, a polymeric or plastic substrate, a nanostructured device, one or more surfaces or components within a processing chamber, one or more surfaces or components of a tool, one or more aerospace surfaces or components, or any combination thereof. Exemplary aerospace components can be or include one or more of turbine blades, turbine vanes, support members, frames, ribs, fins, pin fins, fuel nozzles, combustor liners, combustor shields, heat exchangers, fuel lines, fuel valves, internal cooling channels, or any combination thereof, or any other aerospace component or part that can benefit from having protective coating deposited thereon. The protective coatings can be deposited or otherwise formed on interior surfaces and/or exterior surfaces of the aerospace components or other substrates.

Figure 1A:
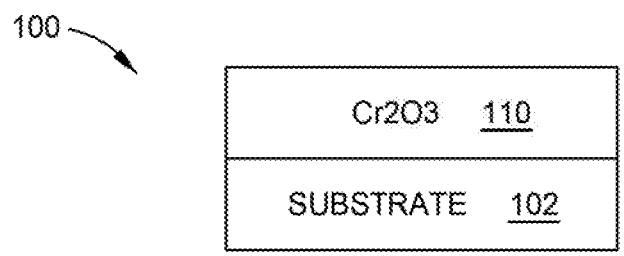
FIGS. 1A-1D are schematic views of a protective coating being formed on a substrate at different stages of a fabrication process, according to one or more embodiments described and discussed herein.

FIGS. 1A-1D are schematic views of a workpiece 100 being processed and illustrate a protective coating 130 being formed on a substrate 102 at different stages of a fabrication process, according to one or more embodiments described and discussed herein. In one or more embodiments, the protective coating 130 is fabricated or otherwise formed by exposing the substrate 102 to one or more chromium precursors and one or more first oxidizing agents to deposit or otherwise form a chromium oxide layer 110 containing amorphous chromium oxide on a surface of the substrate 102 during a first vapor deposition process, as depicted in FIG. 1A. The first vapor deposition process can be a thermal atomic layer deposition (ALD) process, a plasma-enhanced ALD (PE-ALD) process, a thermal chemical vapor deposition (CVD) process, a plasma-enhanced CVD (PE-CVD) process, or any combination thereof.

Figure 1B:
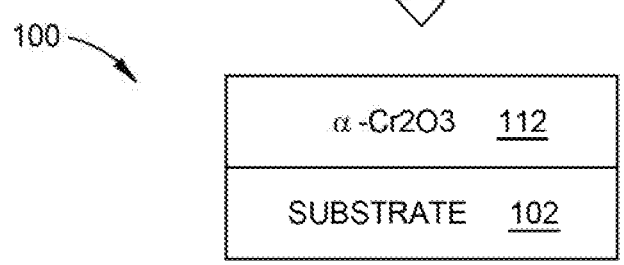

The workpiece 100 containing the chromium oxide layer 110 disposed on the substrate 102 can be annealed or otherwise heated to at least partially convert or completely convert the amorphous chromium oxide in the chromium oxide layer 110 to crystalline chromium oxide during a first annealing process. Thereby, the chromium oxide layer 110 containing the amorphous chromium oxide is converted to a chromium oxide layer 112 containing crystalline chromium oxide, as depicted in FIG. 1B.

Figure 1C:
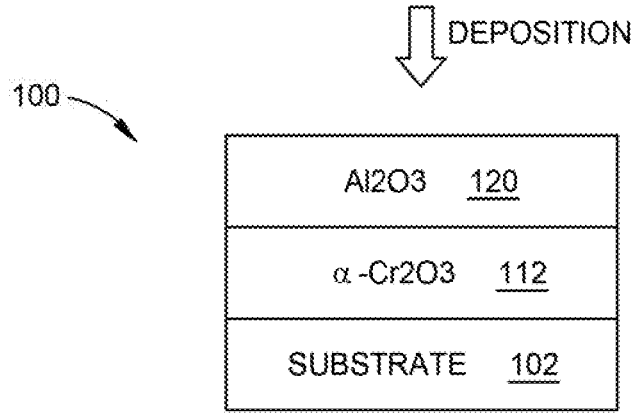

The method also includes exposing the workpiece 100 containing the chromium oxide layer 112 to one or more aluminum precursors and one or more second oxidizing agents to deposit or otherwise form an aluminum oxide layer 120 containing amorphous aluminum oxide on the chromium oxide layer 112 during a second vapor deposition process, as depicted in FIG. 1C. The second vapor deposition process can be a thermal ALD process, a PE-ALD process, a thermal CVD process, a PE-CVD process, or any combination thereof.

Figure 1D:
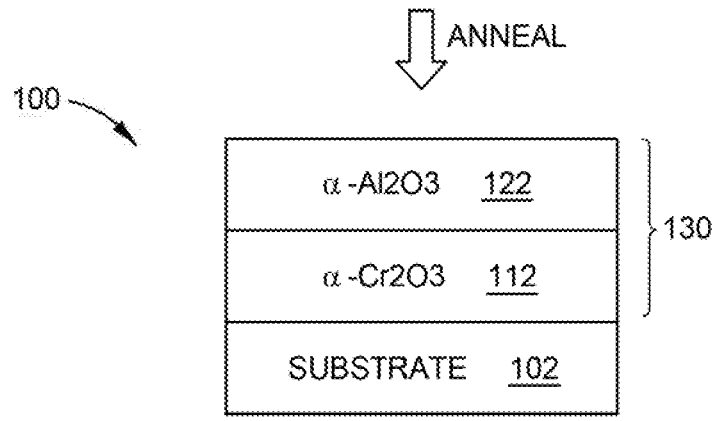

The workpiece 100 containing the aluminum oxide layer 120 disposed on the chromium oxide layer 112 can be annealed or otherwise heated to at least partially convert or completely convert the amorphous aluminum oxide in the aluminum oxide layer 120 is converted to crystalline aluminum oxide during a second annealing process. Thereby, the aluminum oxide layer 120 containing the amorphous aluminum oxide is converted to an aluminum oxide layer 122 containing crystalline aluminum oxide, as depicted in FIG. 1D. The protective coating 130 includes the aluminum oxide layer 122 containing crystalline aluminum oxide disposed on the chromium oxide layer 112 containing crystalline chromium oxide.

In one or more examples, the chromium oxide layer 112 containing crystalline chromium oxide acts a crystallization template to help grow or produce the crystalline aluminum oxide in the aluminum oxide layer 122.

Figure 2A:
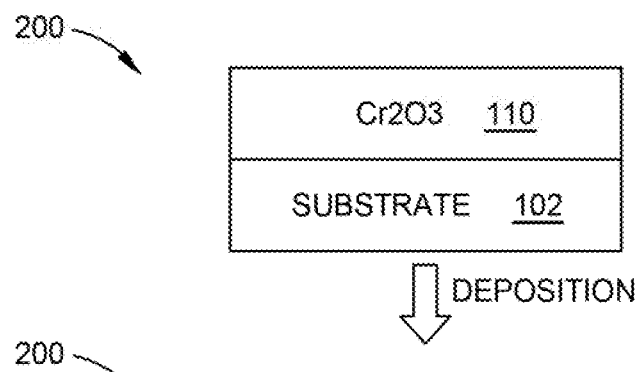
FIGS. 2A-2C are schematic views of a protective coating being formed on a substrate at different stages of another fabrication process, according to one or more embodiments described and discussed herein.
Figure 2B:
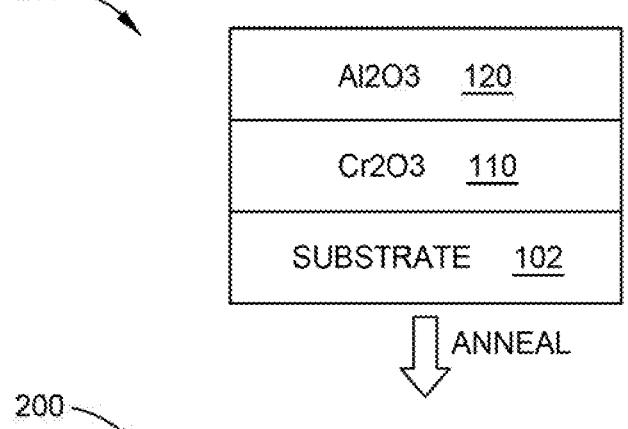
Figure 2C:
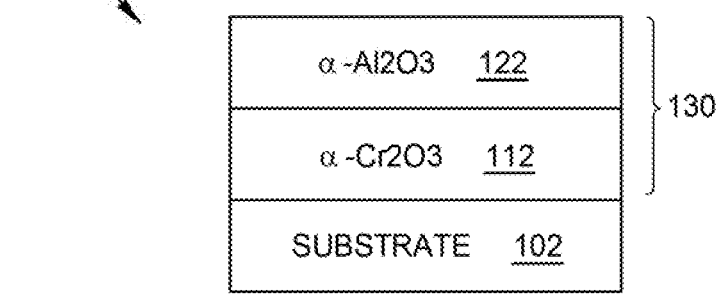

FIGS. 2A-2C are schematic views of a workpiece 200 being processed and illustrate a protective coating 130 being formed on a substrate 102 at different stages of a fabrication process, according to one or more embodiments described and discussed herein. The protective coating 130 on workpiece 200 is made by a different fabrication process than the protective coating 130 on workpiece 100. Instead of conducting the first and second annealing processes for producing the protective coating 130 on workpiece 100, the first annealing process is omitted to produce the protective coating 130 on workpiece 200.

In one or more embodiments, the protective coating 130 is fabricated or otherwise formed by exposing the substrate 102 to one or more chromium precursors and one or more first oxidizing agents to deposit or otherwise form the chromium oxide layer 110 containing amorphous chromium oxide on a surface of the substrate 102 during the vapor first deposition process, as depicted in FIG. 2A.

Thereafter, the method includes exposing the workpiece 200 containing the chromium oxide layer 110 to one or more aluminum precursors and one or more second oxidizing agents to deposit or otherwise form the aluminum oxide layer 120 containing amorphous aluminum oxide on the chromium oxide layer 110 containing amorphous chromium oxide during the second vapor deposition process, as depicted in FIG. 2B.

Subsequently, the workpiece 200 containing the aluminum oxide layer 120 disposed on the chromium oxide layer 110 can be annealed or otherwise heated to at least partially convert or completely convert the amorphous oxides to crystalline oxides in both the chromium oxide layer 110 and the aluminum oxide layer 120. For example, the amorphous chromium oxide in the chromium oxide layer 110 is converted to crystalline chromium oxide and the amorphous aluminum oxide in the aluminum oxide layer 120 is converted to crystalline aluminum oxide during a single annealing process. As such, the chromium oxide layer 110 containing the amorphous chromium oxide is converted to the chromium oxide layer 112 containing crystalline chromium oxide and the aluminum oxide layer 120 containing the amorphous aluminum oxide is converted to the aluminum oxide layer 122 containing crystalline aluminum oxide, as depicted in FIG. 2C. The protective coating 130 on the workpiece 200 includes the aluminum oxide layer 122 containing crystalline aluminum oxide disposed on the chromium oxide layer 112 containing crystalline chromium oxide.

Figure 3A:
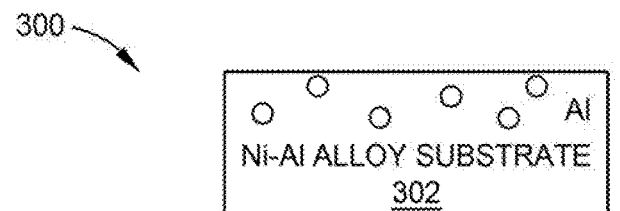
FIGS. 3A-3E are schematic views of another protective coating being formed on a substrate at different stages of another fabrication process, according to one or more embodiments described and discussed herein.

FIGS. 3A-3E are schematic views of a workpiece 300 being processed and illustrate a protective coating 330 being formed on a substrate 302 at different stages of a fabrication process, according to one or more embodiments described and discussed herein. The substrate 302, as depicted in FIG. 3A, can be or include any type of substrate that includes at least metallic aluminum, for example one or more nickel-aluminum alloys, one or more nickel superalloys, or other aluminum-containing alloys. In one or more examples, the substrate 302 can be or include one or more aerospace components, parts, or surfaces as described and discussed herein.

Figure 3B:
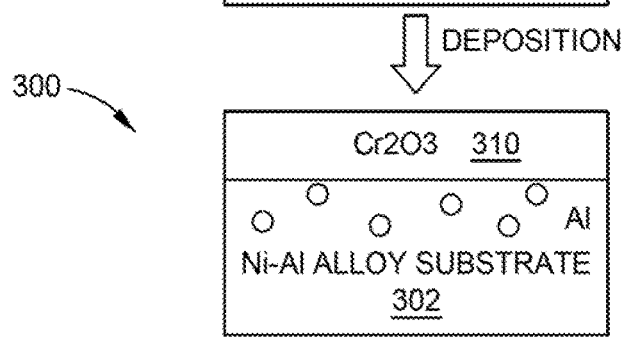
Figure 3C:
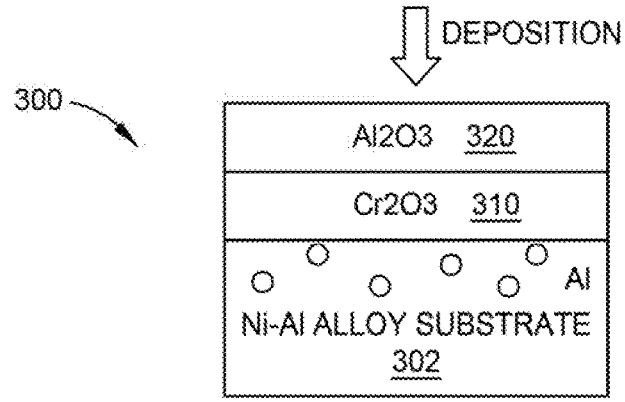

In one or more embodiments, a method of forming the protective coating 330 on the substrate 302 includes depositing a chromium oxide layer 310 containing amorphous chromium oxide on a surface of the substrate 302 during a first vapor deposition process, such as ALD or CVD, as depicted in FIG. 3B. An upper aluminum oxide layer 320 containing amorphous aluminum oxide is deposited or otherwise formed on the chromium oxide layer 310 during a second vapor deposition process, such as ALD or CVD, as depicted in FIG. 3C.

Figure 3D:
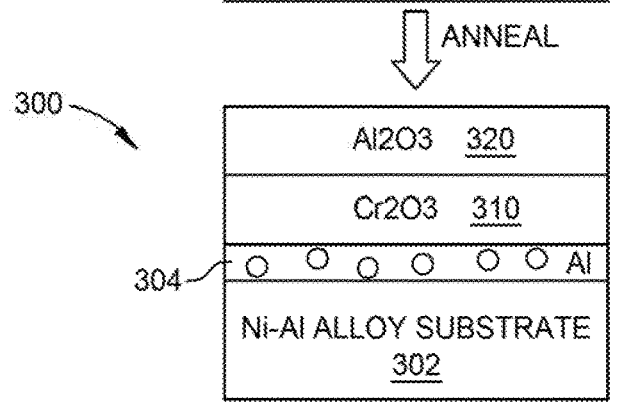

The workpiece 300, including the substrate 302 containing the upper aluminum oxide layer 320 disposed on the chromium oxide layer 310, is annealed or otherwise heated during a first annealing process. The aluminum atoms diffuse from the nickel-aluminum alloy in the substrate 302 to form a layer 304 containing a concentrated amount of aluminum, as depicted in FIG. 3D. The layer 304 is at the interface disposed between the substrate 302 and the chromium oxide layer 310. The layer at the interface contains a greater concentration of aluminum atoms or metallic aluminum after the first annealing process than the substrate 302 contained before the first annealing process.

Figure 3E:
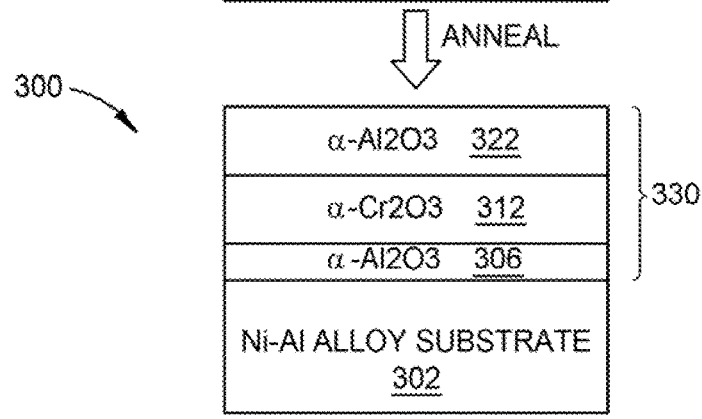

The workpiece 300, including the substrate 302 containing the upper aluminum oxide layer 320 disposed on the chromium oxide layer 310 disposed on the layer 304, is annealed or otherwise heated during a second annealing process. The atomic or metallic aluminum in the layer 304 is oxidized to form aluminum oxide. Also, the amorphous chromium oxide in the chromium oxide layer 310 is converted to crystalline chromium oxide and the amorphous aluminum oxide in the aluminum oxide layer 320 is converted to crystalline aluminum oxide during a single annealing process. As such, the chromium oxide layer 310 containing the amorphous chromium oxide is converted to the chromium oxide layer 312 containing crystalline chromium oxide and the aluminum oxide layer 320 containing the amorphous aluminum oxide is converted to the aluminum oxide layer 322 containing crystalline aluminum oxide, as depicted in FIG. 3E. Furthermore, the aluminum oxide in the layer 304 is formed as and/or converted to crystalline aluminum oxide to produce a lower aluminum oxide layer 306 containing crystalline aluminum oxide during the second annealing process. The protective coating 330 on the workpiece 300 includes the upper aluminum oxide layer 322 containing crystalline aluminum oxide disposed on the chromium oxide layer 312 containing crystalline chromium oxide disposed on the lower aluminum oxide layer 306 containing crystalline aluminum oxide.

In one or more examples, the chromium oxide layer 312 containing crystalline chromium oxide acts as a crystallization template to help grow or produce the crystalline aluminum oxide in both the lower aluminum oxide layer 306 and the upper aluminum oxide layer 322.

Pre-Clean Substrate

Prior to depositing the chromium oxide layer 110 or 310 and prior to starting the fabrication of the protective coating 130 or 330, the substrate 102, 302 can optionally be exposed to one or more pre-clean processes. The surfaces of the substrate 102, 302 can contain oxides, organics, oil, soil, particulate, debris, and/or other contaminants are removed prior to producing the protective coating 130 or 330 on the substrate 102, 302. The pre-clean process can be or include one or more basting or texturing processes, vacuum purges, solvent clean, acid clean, wet clean, plasma clean, sonication, or any combination thereof. Once cleaned and/or textured, the subsequently deposited protective coating 130 or 330 has stronger adhesion to the surfaces of the substrate 102, 302 than if otherwise not exposed to the pre-clean process.

In one or more examples, the surfaces of the substrate 102, 302 can be blasted with or otherwise exposed to beads, sand, carbonate, or other particulates to remove oxides and other contaminates therefrom and/or to provide texturing to the surfaces of the substrate 102, 302. In some examples, the substrate 102, 302 can be placed into a chamber within a pulsed push-pull system and exposed to cycles of purge gas (e.g., $N_2$, Ar, He, or any combination thereof) and vacuum purges to remove debris from small holes on the substrate 102, 302. In other examples, the surfaces of the substrate 102, 302 can be exposed to hydrogen plasma, oxygen or ozone plasma, and/or nitrogen plasma, which can be generated in a plasma chamber or by a remote plasma system.

In one or more examples, such as for organic removal or oxide removal, the surfaces of the substrate 102, 302 can be exposed to a hydrogen plasma, then degassed, then exposed to ozone treatment. In other examples, such as for organic removal, the surfaces of the substrate 102, 302 can be exposed to a wet clean that includes: soaking in an alkaline degreasing solution, rinsing, exposing the surfaces to an acid clean (e.g., sulfuric acid, phosphoric acid, or hydrochloric acid), rinsing, and exposing the surfaces deionized water sonication bath. In some examples, such as for oxide removal, the surfaces of the substrate 102, 302 can be exposed to a wet clean that includes: exposing the surfaces to a dilute acid solution (e.g., acetic acid or hydrochloric acid), rinsing, and exposing the surfaces deionized water sonication bath. In one or more examples, such as for particle removal, the surfaces of the substrate 102, 302 can be exposed to sonication (e.g., megasonication) and/or a supercritical carbon dioxide wash, followed by exposing to cycles of purge gas (e.g., $N_2$, Ar, He, or any combination thereof) and vacuum purges to remove particles from and dry the surfaces. In some examples, the substrate 102, 302 can be exposed to heating or drying processes, such as heating the substrate 102, 302 to a temperature of about 50° C., about 65° C., or about 80° C. to about 100° C., about 120° C., or about 150° C. and exposing to surfaces to the purge gas. The substrate 102, 302 can be heated in an oven or exposed to lamps for the heating or drying processes.

Deposition Processes

In one or more embodiment, the workpiece 100, 200, 300 including the substrate 102, 302 can be exposed to a first precursor (e.g., chromium precursor) and a first reactant (e.g., oxidizing agent) to form the chromium oxide layer 110, 310 on the substrate 102, 302 by a vapor deposition process. The vapor deposition process can be a thermal ALD process, a PE-ALD process, a thermal CVD process, a PE-CVD process, or any combination thereof.

In one or more embodiments, the vapor deposition process is an ALD process and the method includes sequentially exposing the surface of the workpiece 100, 200, 300 or the substrate 102, 302 to the first precursor and the first reactant to form the chromium oxide layer 110, 310. Each cycle of the ALD process includes exposing the surface of the workpiece 100, 200, 300 to the first precursor, conducting a pump-purge, exposing the workpiece 100, 200, 300 to the first reactant, and conducting a pump-purge to form the chromium oxide layer 110, 310. The order of the first precursor and the first reactant can be reversed, such that the ALD cycle includes exposing the surface of the workpiece 100, 200, 300 to the first reactant, conducting a pump-purge, exposing the workpiece 100, 200, 300 to the first precursor, and conducting a pump-purge to form the chromium oxide layer 110, 310.

In some examples, during each ALD cycle, the workpiece 100, 200, 300 is exposed to the first precursor for about 0.1 seconds to about 10 seconds, the first reactant for about 0.1 seconds to about 10 seconds, and the pump-purge for about 0.5 seconds to about 30 seconds. In other examples, during each ALD cycle, the workpiece 100, 200, 300 is exposed to the first precursor for about 0.5 seconds to about 3 seconds, the first reactant for about 0.5 seconds to about 3 seconds, and the pump-purge for about 1 second to about 10 seconds.

Each ALD cycle is repeated from 2, 3, 4, 5, 6, 8, about 10, about 12, or about 15 times to about 18, about 20, about 25, about 30, about 40, about 50, about 65, about 80, about 100, about 120, about 150, about 200, about 250, about 300, about 350, about 400, about 500, about 800, about 1,000, or more times to form the chromium oxide layer 110, 310. For example, each ALD cycle is repeated from 2 times to about 1,000 times, 2 times to about 800 times, 2 times to about 500 times, 2 times to about 300 times, 2 times to about 250 times, 2 times to about 200 times, 2 times to about 150 times, 2 times to about 120 times, 2 times to about 100 times, 2 times to about 80 times, 2 times to about 50 times, 2 times to about 30 times, 2 times to about 20 times, 2 times to about 15 times, 2 times to about 10 times, 2 times to 5 times, about 8 times to about 1,000 times, about 8 times to about 800times, about 8 times to about 500 times, about 8 times to about 300 times, about 8 times to about 250 times, about 8 times to about 200 times, about 8 times to about 150 times, about 8 times to about 120 times, about 8 times to about 100 times, about 8 times to about 80 times, about 8 times to about 50 times, about 8 times to about 30 times, about 8 times to about 20 times, about 8 times to about 15 times, about 8 times to about 10 times, about 20 times to about 1,000 times, about 20 times to about 800 times, about 20 times to about 500 times, about 20 times to about 300 times, about 20 times to about 250 times, about 20 times to about 200 times, about 20 times to about 150 times, about 20 times to about 120 times, about 20 times to about 100 times, about 20 times to about 80 times, about 20 times to about 50 times, about 20 times to about 30 times, about 50 times to about 1,000 times, about 50 times to about 500 times, about 50 times to about 350 times, about 50 times to about 300 times, about 50 times to about 250 times, about 50 times to about 150 times, or about 50 times to about 100 times to form the chromium oxide layer 110, 310.

In other embodiments, the vapor deposition process is a CVD process and the method includes simultaneously exposing the workpiece 100, 200, 300 to the first precursor and the first reactant to form the chromium oxide layer 110, 310. During an ALD process or a CVD process, each of the first precursor and the first reactant can independent include one or more carrier gases. One or more purge gases can be flowed across the surfaces of the workpiece 100, 200, 300 and/or throughout the processing chamber in between the exposures of the first precursor and the first reactant. In some examples, the same gas may be used as a carrier gas and a purge gas. Exemplary carrier gases and/or purge gases can independently be or include one or more of nitrogen ($N_2$), argon, helium, neon, hydrogen ($H_2$), or any combination thereof.

The chromium oxide layer 110, 112, 310, 312 can have a thickness of about 1 nm, about 2 nm, about 3 nm, about 5 nm, about 8 nm, about 10 nm, about 20 nm, about 50 nm, about 100 nm, or about 200 nm to about 250 nm, about 500 nm, about 600 nm, about 750 nm, about 900 nm, about 1,000 nm, about 1,200 nm, about 1,500 nm, about 2,000 nm, about 3,000 nm, about 5,000 nm, about 6,000 nm, about 8,000 nm, about 9,000 nm, or about 10,000 nm. For example, the chromium oxide layer 110, 112, 310, 312 can have a thickness of about 1 nm to about 10,000 nm, about 10 nm to about 10,000 nm, about 50 nm to about 10,000 nm, about 100 nm to about 10,000 nm, about 250 nm to about 10,000 nm, about 500 nm to about 10,000 nm, about 800 nm to about 10,000 nm, about 1,000 nm to about 10,000 nm, about 1,200 nm to about 10,000 nm, about 1,500 nm to about 10,000 nm, about 2,000 nm to about 10,000 nm, about 2,000 nm to about 10,000 nm, about 3,000 nm to about 10,000 nm, about 5,000 nm to about 10,000 nm, about 7,000 nm to about 10,000 nm, about 8,000 nm to about 10,000 nm, about 10 nm to about 5,000 nm, about 50 nm to about 5,000 nm, about 100 nm to about 5,000 nm, about 250 nm to about 5,000 nm, about 500 nm to about 5,000 nm, about 800 nm to about 5,000 nm, about 1,000 nm to about 5,000 nm, about 1,200 nm to about 5,000 nm, about 1,500 nm to about 5,000 nm, about 2,000 nm to about 5,000 nm, about 2,000 nm to about 5,000 nm, about 3,000 nm to about 5,000 nm, about 5,000 nm to about 6,000 nm, about 10 nm to about 1,500 nm, about 50 nm to about 1,500 nm, about 100 nm to about 1,500 nm, about 250 nm to about 1,500 nm, about 500 nm to about 1,500 nm, about 800 nm to about 1,500 nm, about 1,000 nm to about 1,500 nm, about 1,200 nm to about 1,500 nm, or about 1,500 nm to about 1,800 nm.

In one or more embodiments, the first precursor is or contains one or more chromium precursors and the first reactant is or contains one or more oxidizing agents. The chromium precursor can be or include one or more of chromium cyclopentadiene compounds, chromium carbonyl compounds, chromium acetylacetonate compounds, chromium diazadienyl compounds, substitutes thereof, complexes thereof, abducts thereof, salts thereof, or any combination thereof. Exemplary chromium precursor can be or include bis(cyclopentadiene) chromium ($Cp_2Cr$), bis(pentamethylcyclopentadiene) chromium (($Me_5Cp)_2Cr$), bis(isoproplycyclopentadiene) chromium (($iPrCp)_2Cr$), bis(ethylbenzene) chromium (($EtBz)_2Cr$), chromium hexacarbonyl ($Cr(CO)_6$), chromium acetylacetonate ($Cr(acac)_3$, also known as, tris(2,4-pentanediono) chromium), chromium hexafluoroacetylacetonate ($Cr(hfac)_3$), chromium(III) tris(2,2,6,6-tetramethyl-3,5-heptanedionate) {$Cr(tmhd)_3$}, chromium(II) bis(1,4-ditertbutyldiazadienyl), isomers thereof, complexes thereof, abducts thereof, salts thereof, or any combination thereof. Exemplary chromium diazadienyl compounds can have a chemical formula of:

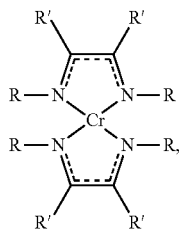

where each R and R' is independently selected from H, C1-C6 alkyl, aryl, acyl, alkylamido, hydrazido, silyl, aldehyde, keto, C2-C4 alkenyl, alkynyl, or substitutes thereof. In some examples, each R is independently a C1-C6 alkyl which is selected from methyl, ethyl, propyl, butyl, or isomers thereof, and R' is H. For example, R is methyl and R' is H, R is ethyl and R' is H, R is iso-propyl and R' is H, or R is tert-butyl and R' is H.

Exemplary oxidizing agents can be or include water (e.g., steam), oxygen ($O_2$), atomic oxygen, ozone, nitrous oxide, one or more peroxides (e.g., hydrogen peroxide, an inorganic peroxide, and/or an organic peroxide), one or more alcohols, plasmas thereof, or any combination thereof. In examples of using two oxidizing agents during different metal oxide depositions, the same or different oxidizing agents can independently be used. For example, the first oxidizing agent used to deposit chromium oxide and the second oxidizing agent used to deposit aluminum oxide can independently be or contain any of these exemplary oxidizing agents.

The workpiece 100, 200, 300 containing the chromium oxide layer 110, 310 is exposed to a second precursor (e.g., aluminum precursor) and a second reactant (e.g., oxidizing agent) to form the aluminum oxide layer 120, 320 on the chromium oxide layer 110, 310 by an ALD process. The second precursor can be or include one or more aluminum precursors and the second reactant can be or include one or more oxidizing agents. During the ALD process, each of the second precursor and the second reactant can independent include one or more carrier gases. One or more purge gases can be flowed across the surfaces of the workpiece 100, 200, 300 and/or throughout the processing chamber in between the exposures of the second precursor and the second reactant. In some examples, the same gas may be used as a carrier gas and a purge gas. Exemplary carrier gases and purge gases can independently be or include one or more of nitrogen ($N_2$), argon, helium, neon, hydrogen ($H_2$), or any combination thereof.

The aluminum precursor can be or include one or more of aluminum alkyl compounds, one or more of aluminum alkoxy compounds, one or more of aluminum acetylacetonate compounds, substitutes thereof, complexes thereof, abducts thereof, salts thereof, or any combination thereof. Exemplary aluminum precursors can be or include trimethylaluminum, triethylaluminum, tripropylaluminum, tributylaluminum, trimethoxyaluminum, triethoxyaluminum, tripropoxyaluminum, tributoxyaluminum, aluminum acetylacetonate ($Al(acac)_3$, also known as, tris(2,4-pentanediono) aluminum), aluminum hexafluoroacetylacetonate ($Al(hfac)_3$), trisdipivaloylmethanatoaluminum ($DPM_3Al$; ($C_{11}H_{19}O_2)_3Al$), isomers thereof, complexes thereof, abducts thereof, salts thereof, or any combination thereof. The oxidizing agent can be or include any one or more of the oxidizing agents described and discussed herein and can be the same or different as used to form the chromium oxide.

Each cycle of the ALD process includes exposing the workpiece 100, 200, 300 to the second precursor, conducting a pump-purge, exposing the workpiece 100, 200, 300 to the second reactant, and conducting a pump-purge to form the aluminum oxide layer 120, 320. The order of the second precursor and the second reactant can be reversed, such that the ALD cycle includes exposing the surface of the workpiece 100, 200, 300 to the second reactant, conducting a pump-purge, exposing the workpiece 100, 200, 300 to the second precursor, and conducting a pump-purge to form the aluminum oxide layer 120, 320.

In one or more examples, during each ALD cycle, the surface of the workpiece 100, 200, 300 is exposed to the second precursor for about 0.1 seconds to about 10 seconds, the second reactant for about 0.1 seconds to about 10 seconds, and the pump-purge for about 0.5 seconds to about 30 seconds. In other examples, during each ALD cycle, the surface of the workpiece 100, 200, 300 is exposed to the second precursor for about 0.5 seconds to about 3 seconds, the second reactant for about 0.5 seconds to about 3 seconds, and the pump-purge for about 1 second to about 10 seconds.

Each ALD cycle is repeated from 2, 3, 4, 5, 6, 8, about 10, about 12, or about 15 times to about 18, about 20, about 25, about 30, about 40, about 50, about 65, about 80, about 100, about 120, about 150, about 200, about 250, about 300, about 350, about 400, about 500, about 800, about 1,000, or more times to form the aluminum oxide layer 120, 320. For example, each ALD cycle is repeated from 2 times to about 1,000 times, 2 times to about 800 times, 2 times to about 500 times, 2 times to about 300 times, 2 times to about 250 times, 2 times to about 200 times, 2 times to about 150 times, 2 times to about 120 times, 2 times to about 100 times, 2 times to about 80 times, 2 times to about 50 times, 2 times to about 30 times, 2 times to about 20 times, 2 times to about 15 times, 2 times to about 10 times, 2 times to 5 times, about 8 times to about 1,000 times, about 8 times to about 800 times, about 8 times to about 500 times, about 8 times to about 300 times, about 8 times to about 250 times, about 8 times to about 200 times, about 8 times to about 150 times, about 8 times to about 120 times, about 8 times to about 100 times, about 8 times to about 80 times, about 8 times to about 50 times, about 8 times to about 30 times, about 8 times to about 20 times, about 8 times to about 15 times, about 8 times to about 10 times, about 20 times to about 1,000 times, about 20 times to about 800 times, about 20 times to about 500 times, about 20 times to about 300 times, about 20 times to about 250 times, about 20 times to about 200 times, about 20 times to about 150 times, about 20 times to about 120 times, about 20 times to about 100 times, about 20 times to about 80 times, about 20 times to about 50 times, about 20 times to about 30 times, about 50 times to about 1,000 times, about 50 times to about 500 times, about 50 times to about 350 times, about 50 times to about 300 times, about 50 times to about 250 times, about 50 times to about 150 times, or about 50 times to about 100 times to form the aluminum oxide layer 120, 320.

The aluminum oxide layer 120, 122, 320, 322 can have a thickness of about 1 nm, about 2 nm, about 3 nm, about 5 nm, about 8 nm, about 10 nm, about 20 nm, about 50 nm, about 100 nm, or about 200 nm to about 250 nm, about 500 nm, about 600 nm, about 750 nm, about 900 nm, about 1,000 nm, about 1,200 nm, about 1,500 nm, about 2,000 nm, about 3,000 nm, about 5,000 nm, about 6,000 nm, about 8,000 nm, about 9,000 nm, or about 10,000 nm. For example, the aluminum oxide layer 120, 122, 320, 322 can have a thickness of about 1 nm to about 10,000nm, about 10 nm to about 10,000 nm, about 50 nm to about 10,000 nm, about 100 nm to about 10,000 nm, about 250 nm to about 10,000 nm, about 500 nm to about 10,000 nm, about 800 nm to about 10,000 nm, about 1,000 nm to about 10,000 nm, about 1,200 nm to about 10,000 nm, about 1,500 nm to about 10,000 nm, about 2,000 nm to about 10,000 nm, about 2,000 nm to about 10,000 nm, about 3,000 nm to about 10,000 nm, about 5,000 nm to about 10,000 nm, about 7,000 nm to about 10,000 nm, about 8,000 nm to about 10,000 nm, about 10 nm to about 5,000 nm, about 50 nm to about 5,000 nm, about 100 nm to about 5,000 nm, about 250 nm to about 5,000 nm, about 500 nm to about 5,000 nm, about 800 nm to about 5,000 nm, about 1,000 nm to about 5,000 nm, about 1,200 nm to about 5,000 nm, about 1,500 nm to about 5,000 nm, about 2,000 nm to about 5,000 nm, about 2,000 nm to about 5,000 nm, about 3,000 nm to about 5,000 nm, about 5,000 nm to about 6,000 nm, about 10 nm to about 1,500 nm, about 50 nm to about 1,500 nm, about 100 nm to about 1,500 nm, about 250 nm to about 1,500 nm, about 500 nm to about 1,500 nm, about 800 nm to about 1,500 nm, about 1,000 nm to about 1,500 nm, about 1,200 nm to about 1,500 nm, or about 1,500 nm to about 1,800 nm.

In one or more examples, the chromium oxide layer 120 containing the amorphous chromium oxide is deposited by a first ALD process and the aluminum oxide layer 130 containing the amorphous aluminum oxide is deposited by a second ALD process.

In some embodiments, the aluminum oxide layer 120, 122, 320, 322 can contain doped aluminum oxide. The doped aluminum oxide can improve adhesion strength between neighboring surfaces, layers, or films and/or improve corrosion-resistant properties by segregating into grain boundaries. Exemplary dopants contained in the aluminum oxide layer 120, 122, 320, 322 can be or include one or more of hafnium, hafnium oxide, zirconium, zirconium oxide, yttrium, yttrium oxide, dopants thereof, or any combination thereof. In various examples, the aluminum oxide layer 120, 122, 320, 322 can be or include a combination of aluminum oxide and hafnium oxide, a hafnium-doped aluminum oxide, hafnium aluminate, a combination of aluminum oxide and zirconium oxide, a zirconium-doped aluminum oxide, zirconium aluminate, a combination of aluminum oxide and yttrium oxide, a yttrium-doped aluminum oxide, yttrium aluminate, dopants thereof, or any combination thereof.

The aluminum oxide layer 120, 122, 320, 322 contain can be formed or otherwise produced with different ratios of metals throughout the material, such as a doping metal or grading metal contained within a base metal, where any of the metal can be in any chemically oxidized form (e.g., oxide, nitride, silicide, carbide, or combinations thereof). In one or more examples, the a first deposited layer containing aluminum oxide is deposited by ALD and a second deposited layer containing a dopant metal or metal oxide is deposited by ALD. For example, the first deposited layer containing aluminum oxide can be deposited by two or more (3, 4, 5, 6, 7, 8, 9, 10, or more) ALD cycles to produce the respectively same amount of sub-layers (e.g., one sub-layer for each ALD cycle), and then the second deposited layer containing a dopant metal or metal oxide can be deposited by one ALD cycle or a number of ALD cycles. In other examples, the first deposited layer containing aluminum oxide can be deposited by CVD to a first thickness and the second deposited layer containing a dopant metal or metal oxide is deposited by CVD to a second thickness. The first deposited layer can be exposed to one or more aluminum precursors and one or more oxidizing agents to deposit or otherwise produce an aluminum oxide layer. The second deposited layer can be exposed to one or more hafnium precursors, one or more zirconium precursors, and/or one or more yttrium precursors as well as one or more reducing agents or one or more oxidizing agents to deposit or otherwise produce a metallic layer or a metal oxide layer. The first and second layers can be annealed to produce the aluminum oxide layer 120, 122, 320, 322 containing doped aluminum oxide.

In other embodiments, an ALD process can be used to deposit the first deposited layer containing aluminum oxide and/or the second deposited layer containing a dopant metal or metal oxide where the deposited material is doped by including a dopant precursor during the ALD process. In some examples, the dopant precursor can be included a separate ALD cycle relative to the ALD cycles used to deposit the base material. In other examples, the dopant precursor can be co-injected with any of the chemical precursors used during the ALD cycle. In further examples, the dopant precursor can be injected separate from the chemical precursors during the ALD cycle. For example, one ALD cycle can include exposing the aerospace component to: the first precursor, a pump-purge, the dopant precursor, a pump-purge, the first reactant, and a pump-purge to form the deposited layer. In some examples, one ALD cycle can include exposing the aerospace component to: the dopant precursor, a pump-purge, the first precursor, a pump-purge, the first reactant, and a pump-purge to form the deposited layer. In other examples, one ALD cycle can include exposing the aerospace component to: the first precursor, the dopant precursor, a pump-purge, the first reactant, and a pump-purge to form the deposited layer.

The aluminum oxide layer 120, 122, 320, 322 can have a dopant concentration of about 0.01 atomic percent (at %), about 0.05 at %, about 0.08 at %, about 0.1 at %, about 0.5 at %, about 0.8 at %, about 1 at %, about 1.2 at %, about 1.5 at %, about 1.8 at %, or about 2 at % to about 2.5 at %, about 3 at %, about 3.5 at %, about 4 at %, about 5 at %, about 8 at %, or about 10 at %. For example, the aluminum oxide layer 120, 122, 320, 322 can have a dopant concentration of about 0.01 at % to about 10 at %, about 0.01 at % to about 8 at %, about 0.01 at % to about 5 at %, about 0.01 at % to about 4 at %, about 0.01 at % to about 3 at %, about 0.01 at % to about 2.5 at %, about 0.01 at % to about 2 at %, about 0.01 at % to about 1.5 at %, about 0.01 at % to about 1 at %, about 0.01 at % to about 0.8 at %, about 0.01 at % to about 0.5 at %, about 0.01 at % to about 0.3 at %, about 0.01 at % to about 0.1 at %, about 0.01 at % to about 0.05 at %, about 0.05 at % to about 10 at %, about 0.05 at % to about 8 at %, about 0.05 at % to about 5 at %, about 0.05 at % to about 4 at %, about 0.05 at % to about 3 at %, about 0.05 at % to about 2.5 at %, about 0.05 at % to about 2 at %, about 0.05 at % to about 1.5 at %, about 0.05 at % to about 1 at %, about 0.05 at % to about 0.8 at %, about 0.05 at % to about 0.5 at %, about 0.05 at % to about 0.3 at %, about 0.05 at % to about 0.1 at %, about 0.1 at % to about 10 at %, about 0.1 at % to about 8 at %, about 0.1 at % to about 5 at %, about 0.1 at % to about 4 at %, about 0.1 at % to about 3 at %, about 0.1 at % to about 2.5 at %, about 0.1 at % to about 2 at %, about 0.1 at % to about 1.5 at %, about 0.1 at % to about 1 at %, about 0.1 at % to about 0.8 at %, about 0.1 at % to about 0.5 at %, about 0.1 at % to about 0.3 at %, about 0.5 at % to about 10 at %, about 0.5 at % to about 8 at %, about 0.5 at % to about 5 at %, about 0.5 at % to about 4 at %, about 0.5 at % to about 3 at %, about 0.5 at % to about 2.5 at %, about 0.5 at % to about 2 at %, about 0.5 at % to about 1.5 at %, about 0.5 at % to about 1 at %, or about 0.5 at % to about 0.8 at %.

Annealing Process

In one or more embodiments, the workpieces 100, 200, 300 can be exposed to one, two, three, or more heating or annealing processes, as described and discussed herein. The annealing process can be or include a thermal anneal, a plasma anneal, an ultraviolet anneal, a laser anneal, or any combination thereof. The chromium oxide layer 110, 310 containing the amorphous chromium oxide is converted to the chromium oxide layer 112, 312 containing crystalline chromium oxide during one or more heating or annealing processes. The aluminum oxide layer 120, 320 containing the amorphous aluminum oxide is converted to the aluminum oxide layer 122, 322 containing crystalline aluminum oxide one or more heating or annealing processes. In some embodiments, aluminum atoms diffuse from the nickel-aluminum alloy in the substrate 302 to form the layer 304 containing a concentrated amount of aluminum during one or more heating or annealing processes. In one or more embodiments, the atomic or metallic aluminum in the layer 304 is oxidized to form aluminum oxide during one or more heating or annealing processes. In processes for oxidizing aluminum atoms to form aluminum oxide, the annealing gas can be or include one or more oxidizing gases. In other embodiments, the aluminum oxide in the layer 304 is formed as and/or converted to crystalline aluminum oxide to produce the lower aluminum oxide layer 306 containing crystalline aluminum oxide during one or more heating or annealing processes. Throughout the examples, the new crystalline metal oxide contained in the protective coating 130, 330 has enhanced protective properties over similar coatings containing only the amorphous metal oxide.

The workpieces 100, 200, 300 is heated to a temperature of about 400° C., about 450° C., about 500° C., about 550° C., about 600° C., about 650° C., about 700° C. to about 750° C., about 800° C., about 900° C., about 950° C., about 970° C., about 980° C., about 990° C., or less than 1,000° C. during the annealing process. For example, the workpieces 100, 200, 300 is heated to a temperature of about 400° C. to less than 1,000° C., about 400° C. to about 900° C., about 400° C. to about 800° C., about 400° C. to about 700° C., about 400° C. to about 650° C., about 400° C. to about 600° C., about 400° C. to about 550° C., about 400° C. to about 500° C., about 450° C. to less than 1,000° C., about 450° C. to about 950° C., about 450° C. to about 900° C., about 450° C. to about 850° C., about 450° C. to about 800° C, about 450° C. to about 700° C., about 450° C. to about 650° C., about 450° C. to about 600° C., about 450° C. to about 550° C., about 450° C. to about 500° C., about 500° C. to less than 1,000° C., about 500° C. to about 900° C., about 500° C. to about 800° C., about 500° C. to about 700° C., about 500° C. to about 650° C., about 500° C. to about 600° C., about 500° C. to about 550° C., about 550° C. to less than 1,000° C., about 550° C. to about 900° C., about 550° C. to about 800° C., about 550° C. to about 700° C., about 550° C. to about 650° C., or about 550° C. to about 600° C. during the annealing process.

The workpieces 100, 200, 300 can be under a vacuum at a low pressure (e.g., from about 0.1 Torr to less than 760 Torr), at ambient pressure (e.g., about 760 Torr), and/or at a high pressure (e.g., from greater than 760 Torr (1 atm) to about 3,678 Torr (about 5 atm)) during the annealing process. The workpieces 100, 200, 300 can be exposed to an atmosphere containing one or more gases during the annealing process. Exemplary annealing gases used during the annealing process can be or include nitrogen ($N_2$), oxygen ($O_2$), hydrogen ($H_2$), a mixture of nitrogen and oxygen, nitrous oxide, nitric oxide, air, argon, helium, or any mixture thereof. In one or more examples, the annealing gas can be or include one or more oxidizing gases.

In one or more embodiments, the workpieces 100, 200, 300 can be heated during the annealing process for about 0.2 hours, about 0.5 hours, about 0.8 hours, about 1 hour, or about 1.2 hours to about 1.5 hours, about 2 hours, about 2.5 hours, about 3 hours, about 5 hours, about 8 hours, about 10 hours, about 12 hours, or longer. For example, the workpieces 100, 200, 300 can be heated during the annealing process for about 0.2 hours to about 12 hours, about 0.5 hours to about 12 hours, about 0.8 hours to about 12 hours, about 1 hour to about 12 hours, about 1.5 hours to about 12 hours, about 2 hours to about 12 hours, about 3 hours to about 12 hours, about 5 hours to about 12 hours, about 8 hours to about 12 hours, about 10 hours to about 12 hours, about 0.2 hours to less than 10 hours, about 0.5 hours to less than 10 hours, about 0.8 hours to less than 10 hours, about 1 hour to less than 10 hours, about 1.5 hours to less than 10 hours, about 2 hours to less than 10 hours, about 3 hours to less than 10 hours, about 5 hours to less than 10 hours, about 0.2 hours to about 5 hours, about 0.5 hours to about 5 hours, about 0.8 hours to about 5 hours, about 1 hour to about 5 hours, about 1.5 hours to about 5 hours, about 2 hours to about 5 hours, about 3 hours to about 5 hours, about 0.2 hours to about 3 hours, about 0.5 hours to about 3 hours, about 0.8 hours to about 3 hours, about 1 hour to about 3 hours, about 1.5 hours to about 3 hours, about 2 hours to about 3 hours, or about 2.5 hours to about 3 hours.

In other embodiments, the annealing process can be a thermal anneal and lasts for about 1 minute, about 5 minutes, about 10 minutes, or about 30 minutes to about 1 hour, about 2 hours, about 5 hours, about 24 hours, about 50 hours, about 100 hours, or longer. In some embodiments, the annealing process can be a laser anneal or a spike anneal and lasts for about 1 millisecond, about 100 millisecond, or about 1 second to about 5 seconds, about 10 seconds, or about 15 seconds.

In embodiments which include the first and second thermal annealing processes, each of the first annealing process and the second annealing process can independently include heating the workpieces 100, 200, 300 for about 0.5 hours, about 0.8 hours, about 1 hour, about 5 hours, about 10 hours, about 12 hours, about 15 hours, about 20 hours, or about 22 hours to about 24 hours, about 26 hours, about 28 hours, about 30 hours, about 32 hours, about 36 hours, about 40 hours, about 48 hours, about 50 hours, about 60 hours, or longer. For example, the first annealing process and the second annealing process can independently include heating the workpieces 100, 200, 300 for about 0.5 hours to about 60 hours, about 0.5 hours to about 48 hours, about 0.8 hours to about 48 hours, about 0.8 hours to about 30 hours, about 0.8 hours to about 24 hours, about 6 hours to about 60 hours, about 12 hours to about 60 hours, about 15 hours to about 60 hours, about 18 hours to about 60 hours, about 20 hours to about 60 hours, about 22 hours to about 60 hours, about 24 hours to about 60 hours, about 26 hours to about 60 hours, about 30 hours to about 60 hours, about 40 hours to about 60 hours, about 6 hours to about 48 hours, about 12 hours to about 48 hours, about 15 hours to about 48 hours, about 18 hours to about 48 hours, about 20 hours to about 48 hours, about 22 hours to about 48 hours, about 24 hours to about 48 hours, about 26 hours to about 48 hours, about 30 hours to about 48 hours, about 40 hours to about 48 hours, about 6 hours to about 30 hours, about 12 hours to about 30 hours, about 15 hours to about 30 hours, about 18 hours to about 30 hours, about 20 hours to about 30 hours, about 22 hours to about 30 hours, about 24 hours to about 30 hours, about 26 hours to about 30 hours, about 6 hours to about 26 hours, about 12 hours to about 26 hours, about 15 hours to about 26 hours, about 18 hours to about 26 hours, about 20 hours to about 26 hours, about 22 hours to about 26 hours, or about 24 hours to about 26 hours.

In one or more examples, the first annealing process includes heating the workpieces 100, 200, 300 at a temperature of about 400° C. to less than 1,000° C. for about 0.5 hours to about 48 hours and the second annealing process includes heating the workpieces 100, 200, 300 at a temperature of about 400° C. to less than 1,000° C. for about 0.5 hours to about 48 hours during the second annealing process. In other examples, the first annealing process includes heating the workpieces 100, 200, 300 at a temperature of about 450° C. to about 800° C. for about 0.8 hours to about 30 hours and the second annealing process includes heating the workpieces 100, 200, 300 at a temperature of about 450° C. to about 950° C. for about 0.8 hours to about 30 hours during the second annealing process. In some examples, the first annealing process includes heating the workpieces 100, 200, 300 at a temperature of about 550° C. to about 650° C. for about 22 hours to about 26 hours and the second annealing process includes heating the workpieces 100, 200, 300 at a temperature of about 750° C. to about 925° C. for about 22 hours to about 26 hours during the second annealing process.

In other embodiments, the first and/or second annealing processes include heating the workpieces 100, 200, 300 to a temperature of about 400° C. to less than 1,000° C. for about 0.5 hours to about 4 hours. In one or more examples, the first and/or second annealing processes include heating the workpieces 100, 200, 300 to a temperature of about 450° C. to about 800° C. for about 0.8 hours to about 3 hours. In some examples, the first and/or second annealing processes include heating the workpieces 100, 200, 300 to a temperature of about 500° C. to about 700° C. for about 1 hour to about 2 hours.

The protective coating 130, 330 can have a thickness of about 1 nm, about 2 nm, about 3 nm, about 5 nm, about 8 nm, about 10 nm, about 12 nm, about 15 nm, about 20 nm, about 30 nm, about 50 nm, about 60 nm, about 80 nm, about 100 nm, or about 120 nm to about 150 nm, about 180 nm, about 200 nm, about 250 nm, about 300 nm, about 350 nm, about 400 nm, about 500 nm, about 800 nm, about 1,000 nm, about 2,000 nm, about 3,000 nm, about 4,000 nm, about 5,000 nm, about 6,000 nm, about 7,000 nm, about 8,000 nm, about 9,000 nm, about 10,000 nm, or thicker. In some examples, the protective coating 130, 330 can have a thickness of less than 10 μm (less than 10,000 nm). For example, the protective coating 130, 330 can have a thickness of about 1 nm to less than 10,000 nm, about 1 nm to about 8,000 nm, about 1 nm to about 6,000 nm, about 1 nm to about 5,000 nm, about 1 nm to about 3,000 nm, about 1 nm to about 2,000 nm, about 1 nm to about 1,500 nm, about 1 nm to about 1,000 nm, about 1 nm to about 500 nm, about 1 nm to about 400 nm, about 1 nm to about 300 nm, about 1 nm to about 250 nm, about 1 nm to about 200 nm, about 1 nm to about 150 nm, about 1 nm to about 100 nm, about 1 nm to about 80 nm, about 1 nm to about 50 nm, about 20 nm to about 500 nm, about 20 nm to about 400 nm, about 20 nm to about 300 nm, about 20 nm to about 250 nm, about 20 nm to about 200 nm, about 20 nm to about 150 nm, about 20 nm to about 100 nm, about 20 nm to about 80 nm, about 20 nm to about 50 nm, about 30 nm to about 400 nm, about 30 nm to about 200 nm, about 50 nm to about 500 nm, about 50 nm to about 400 nm, about 50 nm to about 300 nm, about 50 nm to about 250 nm, about 50 nm to about 200 nm, about 50 nm to about 150 nm, about 50 nm to about 100 nm, about 80 nm to about 250 nm, about 80 nm to about 200 nm, about 80 nm to about 150 nm, about 80 nm to about 100 nm, about 50 nm to about 80 nm, about 100 nm to about 500 nm, about 100 nm to about 400 nm, about 100 nm to about 300 nm, about 100 nm to about 250 nm, about 100 nm to about 200 nm, or about 100 nm to about 150 nm.

In one or more embodiments, the protective coating 130, 330 can have a relatively high degree of uniformity. The protective coating 130, 330 can have a uniformity of less than 50%, less than 40%, or less than 30% of the thickness of the respective protective coating 200, 250. The protective coating 130, 330 can independently have a uniformity from about 0%, about 0.1%, about 0.5%, about 1%, about 2%, about 3%, about 5%, about 8%, or about 10% to about 12%, about 15%, about 18%, about 20%, about 22%, about 25%, about 28%, about 30%, about 35%, about 40%, about 45%, or less than 50% of the thickness. For example, the protective coating 130, 330 can independently have a uniformity from about 0% to about 50%, about 0% to about 40%, about 0% to about 30%, about 0% to less than 30%, about 0% to about 28%, about 0% to about 25%, about 0% to about 20%, about 0% to about 15%, about 0% to about 10%, about 0% to about 8%, about 0% to about 5%, about 0% to about 3%, about 0% to about 2%, about 0% to about 1%, about 0.1% to about 50%, about 0.1% to about 40%, about 0.1% to about 30%, about 0.1% to less than 30%, about 0.1% to about 28%, about 0.1% to about 25%, about 0.1% to about 20%, about 0.1% to about 15%, about 0.1% to about 10%, about 0.1% to about 8%, about 0.1% to about 5%, about 0.1% to about 3%, about 0.1% to about 2%, about 0.1% to about 1%, about 1% to about 50%, about 1% to about 40%, about 1% to about 30%, about 1% to less than 30%, about 1% to about 28%, about 1% to about 25%, about 1% to about 20%, about 1% to about 15%, about 1% to about 10%, about 1% to about 8%, about 1% to about 5%, about 1% to about 3%, about 1% to about 2%, about 5% to about 50%, about 5% to about 40%, about 5% to about 30%, about 5% to less than 30%, about 5% to about 28%, about 5% to about 25%, about 5% to about 20%, about 5% to about 15%, about 5% to about 10%, about 5% to about 8%, about 10% to about 50%, about 10% to about 40%, about 10% to about 30%, about 10% to less than 30%, about 10% to about 28%, about 10% to about 25%, about 10% to about 20%, about 10% to about 15%, or about 10% to about 12% of the thickness.

Figure 4B:
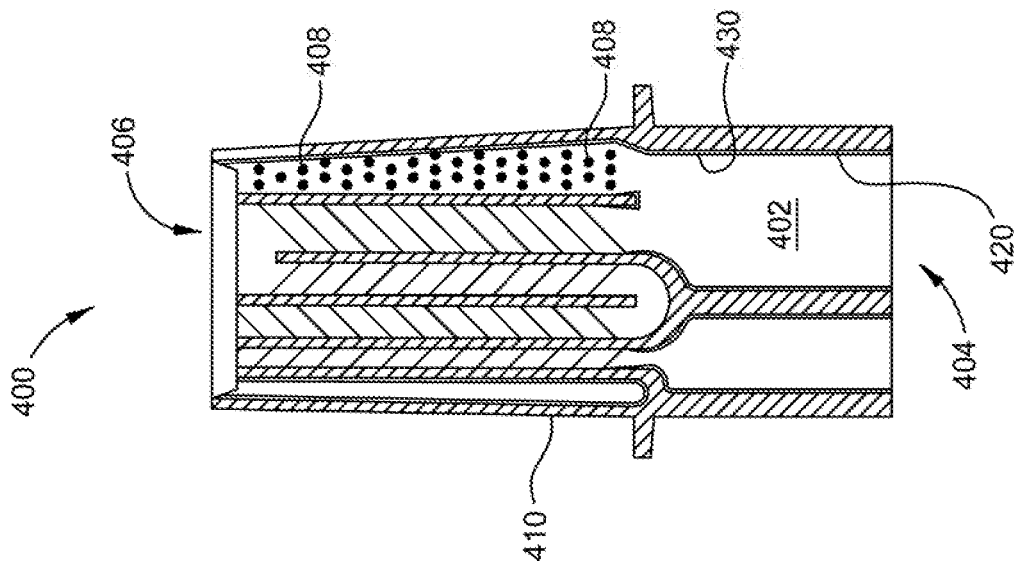
FIGS. 4A and 4B are schematic views of an aerospace component containing one or more protective coatings, according to one or more embodiments described and discussed herein.
Figure 4A:
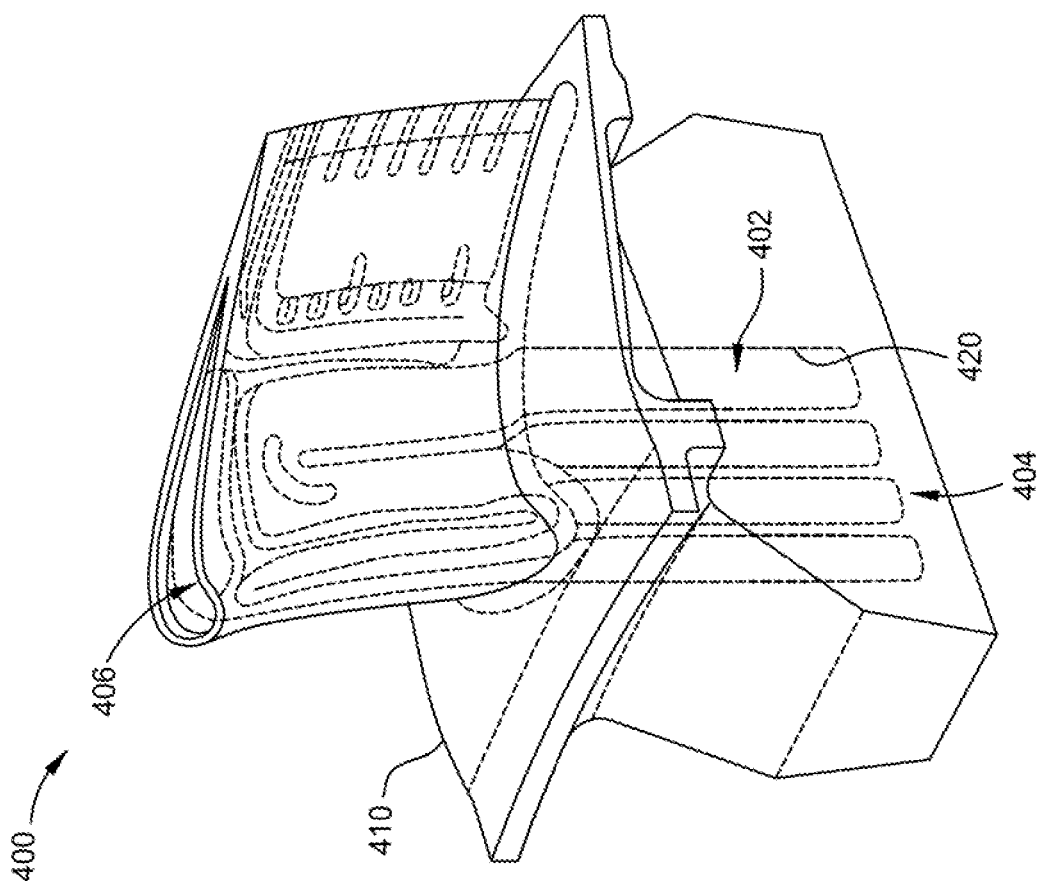

FIGS. 4A and 4B are schematic views of an aerospace component 400 containing a protective coating 430, according to one or more embodiments described and discussed herein. FIG. 4A is a perspective view of the aerospace component 400 and FIG. 4B is a cross-sectional view of the aerospace component 400. The protective coating 430 can be or include the protective coating 130 (FIGS. 1D and 2C) and/or the protective coating 330 (FIG. 3E). Similarly, the aerospace component 400 can be or include the substrate 102, 302 (FIGS. 1A-3E). Aerospace components as described and discussed herein, including aerospace component 400, can be or include one or more components or portions thereof of a turbine, an aircraft, a spacecraft, or other devices that can include one or more turbines (e.g., compressors, pumps, turbo fans, super chargers, and the like). Exemplary aerospace components 400 can be or include a turbine blade, a turbine vane, a support member, a frame, a rib, a fin, a pin fin, a fuel nozzle, a combustor liner, a combustor shield, a heat exchanger, a fuel line, a fuel valve, an internal cooling channel, or any combination thereof.

The aerospace component 400 has one or more outer or exterior surfaces 410 and one or more inner or interior surfaces 420. The interior surfaces 420 can define one or more cavities 402 extending or contained within the aerospace component 400. The cavities 402 can be channels, passages, spaces, or the like disposed between the interior surfaces 420. The cavity 402 can have one or more openings 404, 406, and 408. Each of the cavities 402 within the aerospace component 400 typically have aspect ratios (e.g., length divided by width) of greater than 1. The methods described and discussed herein provide depositing and/or otherwise forming the protective coating 430 on the interior surfaces 420 with high aspect ratios (greater than 1) and/or within the cavities 402.

The aspect ratio of the cavity 402 can be from about 2, about 3, about 5, about 8, about 10, or about 12 to about 15, about 20, about 25, about 30, about 40, about 50, about 65, about 80, about 100, about 120, about 150, about 200, about 250, about 300, about 500, about 800, about 1,000, or greater. For example, the aspect ratio of the cavity 402 can be from about 2 to about 1,000, about 2 to about 500, about 2 to about 200, about 2 to about 150, about 2 to about 120, about 2 to about 100, about 2 to about 80, about 2 to about 50, about 2 to about 40, about 2 to about 30, about 2 to about 20, about 2 to about 10, about 2 to about 8, about 5 to about 1,000, about 5 to about 500, about 5 to about 200, about 5 to about 150, about 5 to about 120, about 5 to about 100, about 5 to about 80, about 5 to about 50, about 5 to about 40, about 5 to about 30, about 5 to about 20, about 5 to about 10, about 5 to about 8, about 10 to about 1,000, about 10 to about 500, about 10 to about 200, about 10 to about 150, about 10 to about 120, about 10 to about 100, about 10 to about 80, about 10 to about 50, about 10 to about 40, about 10 to about 30, about 10 to about 20, about 20 to about 1,000, about 20 to about 500, about 20 to about 200, about 20 to about 150, about 20 to about 120, about 20 to about 100, about 20 to about 80, about 20 to about 50, about 20 to about 40, or about 20 to about 30.

The aerospace component 400 and any surface thereof including one or more outer or exterior surfaces 410 and/or one or more inner or interior surfaces 420 can be made of, contain, or otherwise include one or more metals, such as nickel, one or more nickel superalloys, one or more nickel-aluminum alloys, aluminum, iron, one or more stainless steels, cobalt, chromium, molybdenum, titanium, one or more Inconel alloys, one or more Hastelloy alloys, alloys thereof, or any combination thereof. The protective coating 430 can be deposited, formed, or otherwise produced on any surface of the aerospace component 400 including one or more outer or exterior surfaces 410 and/or one or more inner or interior surfaces 420.

The protective coating, as described and discussed herein, can be or include one or more of laminate film stacks, coalesced films, graded compositions, and/or monolithic films which are deposited or otherwise formed on any surface of an aerospace component. In some examples, the protective coating contains from about 1% to about 100% chromium oxide. The protective coatings are conformal and substantially coat rough surface features following surface topology, including in open pores, blind holes, and non-line-of sight regions of a surface. The protective coatings do not substantially increase surface roughness, and in some embodiments, the protective coatings may reduce surface roughness by conformally coating roughness until it coalesces. The protective coatings may contain particles from the deposition that are substantially larger than the roughness of the aerospace component, but are considered separate from the monolithic film. The protective coatings are substantially well adhered and pinhole free. The thickness of the protective coatings varies within 1-sigma of 40%. In one or more embodiments, the thickness varies less than 1-sigma of 20%, 10%, 5%, 1%, or 0.1%.

The protective coatings provide corrosion and oxidation protection when the aerospace components are exposed to air, oxygen, sulfur and/or sulfur compounds, acids, bases, salts (e.g., Na, K, Mg, Li, or Ca salts), or any combination thereof.

In some embodiments, the chromium precursor (at a temperature of about 0° C. to about 250° C.) is delivered to the aerospace component via vapor phase delivery for at pre-determined pulse length of 5 seconds. During this process, the processing chamber is operated under a flow of nitrogen carrier gas (about 1,000 sccm total) with the processing chamber held at a pre-determined temperature of about 350° C. and pressure of about 3.5 Torr. After the pulse of the chromium precursor, the processing chamber is then subsequently pumped and purged of all requisite gases and byproducts for a determined amount of time. Subsequently, water is pulsed into the processing chamber for 0.1 seconds at chamber pressure of about 3.5 Torr. An additional chamber purge (or pump/purge) is then performed to rid the processing chamber of any excess reactants and reaction byproducts. This process is repeated as many times as necessary to get the target chromium oxide film to the desired film thickness.

For the secondary film (example: aluminum oxide), the precursor, trimethylaluminum (at a temperature of about 0° C. to about 30° C.) is delivered to the aerospace component via vapor phase delivery for at pre-determined pulse length of 0.1 seconds. During this process, the processing chamber is operated under a flow of nitrogen carrier gas (100 sccm total) with the processing chamber held at a pre-determined temperature of about 150° C. to about 350° C. and pressure about 1 Torr to about 5 Torr. After the pulse of trimethylaluminum, the processing chamber is then subsequently pumped and purged of all requisite gases and byproducts for a determined amount of time. Subsequently, water vapor is pulsed into the processing chamber for about 0.1 seconds at chamber pressure of about 3.5 Torr. An additional chamber purge is then performed to rid the processing chamber of any excess reactants and reaction byproducts. This process is repeated as many times as necessary to get the target $Al_2O_3$ film to the desired film thickness. The aerospace component is then subjected to an annealing furnace at a temperature of about 500° C. under inert nitrogen flow of about 500 sccm for about one hour.

In some embodiments, the chromium precursor, bis(1,4-ditertbutyldiazadienyl chromium (II) (at a temperature of about 0° C. to about 250° C.) is delivered to the aerospace component via vapor phase delivery for at pre-determined pulse length of 5 seconds. During this process, the processing chamber is operated under a flow of nitrogen carrier gas of about 1,000 sccm with the processing chamber held at a pre-determined temperature of about 350° C. and pressure of about 3.5 Torr. After the pulse of the chromium precursor, the processing chamber is then subsequently pumped and purged of all requisite gases and byproducts for a determined amount of time. Subsequently, a second reactant, water is pulsed into the processing chamber for 0.1 seconds at chamber pressure of about 3.5 Torr. A second chamber purge is then performed to rid the processing chamber of any excess reactants and reaction byproducts.

This chromium precursor/pump-purge/water/pump-purge sequence is repeated as many times as necessary to get the target chromium oxide film to the desired film thickness. This process results in the formation of a first chromium oxide laminate layer with desired thickness.

In some embodiments, the selected Al precursor, trimethylaluminum (TMA) (at a temperature of about 0° C. to about 30° C.) is delivered to the aerospace component via vapor phase delivery for at pre-determined pulse length of about 0.1 seconds to about 1 second. During this process, the processing chamber is operated under a flow of nitrogen carrier gas of about 100 sccm with the processing chamber held at a pre-determined temperature of about 150° C. to about 350° C. and pressure of about 1 Torr to about 5 Torr. After the pulse of trimethylaluminum, the processing chamber is then subsequently pumped and purged of all requisite gases and byproducts for a determined amount of time. Subsequently, water vapor is pulsed into the processing chamber for 3 seconds at chamber pressure of about 1 Torr to about 5 Torr. An additional chamber purge is then performed to rid the processing chamber of any excess reactants and reaction byproducts. The aluminum precursor/pump-purge/water/pump-purge sequence is repeated as many times as necessary to get the target AlOx (e.g., $Al_2O_3$) film to the desired film thickness. This process results in the formation of a first AlOx laminate layer with desired thickness.

In one or more embodiments, an aerospace component includes a protective coating disposed on a surface of a substrate. The surface or substrate includes or contains nickel, nickel superalloy, nickel-aluminum alloy, aluminum, chromium, iron, titanium, alloys thereof, or any combination thereof. The protective coating includes a chromium oxide layer disposed on an aluminum oxide layer. In some examples, the chromium oxide layer contains crystalline chromium oxide and the aluminum oxide layer contains crystalline aluminum oxide. The surface of the aerospace component can have an interior surface within a cavity of the aerospace component. The cavity can have an aspect ratio of about 5 to about 1,000 and the coating can have a uniformity of less than 30% of the thickness across the interior surface.

Embodiments of the present disclosure further relate to any one or more of the following paragraphs 1-27:

1. A method of forming a protective coating on a substrate, comprising: exposing the substrate to a chromium precursor and a first oxidizing agent to form a chromium oxide layer comprising amorphous chromium oxide on a surface of the substrate during a first atomic layer deposition (ALD) process or a first chemical vapor deposition (CVD) process; heating the substrate containing the chromium oxide layer comprising the amorphous chromium oxide to convert at least a portion of the amorphous chromium oxide to crystalline chromium oxide during a first annealing process; exposing the substrate to an aluminum precursor and a second oxidizing agent to form an aluminum oxide layer comprising amorphous aluminum oxide on the chromium oxide layer during a second ALD process or a second CVD process; and heating the substrate containing the aluminum oxide layer disposed on the chromium oxide layer to convert at least a portion of the amorphous aluminum oxide to crystalline aluminum oxide during a second annealing process.

2. A method of forming a protective coating on a substrate, comprising: exposing the substrate to a chromium precursor and a first oxidizing agent to form a chromium oxide layer comprising amorphous chromium oxide on a surface of the substrate during a first ALD process; heating the substrate containing the chromium oxide layer comprising the amorphous chromium oxide to convert at least a portion of the amorphous chromium oxide to crystalline chromium oxide during a first annealing process; exposing the substrate to an aluminum precursor and a second oxidizing agent to form an aluminum oxide layer comprising amorphous aluminum oxide on the chromium oxide layer during a second ALD process; and heating the substrate containing the aluminum oxide layer disposed on the chromium oxide layer to convert at least a portion of the amorphous aluminum oxide to crystalline aluminum oxide during a second annealing process.

3. A method of forming a protective coating on a substrate, comprising: exposing the substrate to a chromium precursor and a first oxidizing agent to form a chromium oxide layer on a surface of the substrate during a first ALD process or a first CVD process; exposing the substrate to an aluminum precursor and a second oxidizing agent to form an aluminum oxide layer comprising amorphous aluminum oxide on the chromium oxide layer during a second ALD process or a second CVD process; and heating the substrate containing the aluminum oxide layer disposed on the chromium oxide layer to convert the amorphous aluminum oxide to crystalline aluminum oxide.

4. A method of forming a protective coating on a substrate, comprising: depositing a chromium oxide layer comprising amorphous chromium oxide on a surface of the substrate during a first ALD process or a first CVD process, wherein the substrate comprises a nickel-aluminum alloy; depositing an upper aluminum oxide layer comprising amorphous aluminum oxide on the chromium oxide layer during a second ALD process or a second CVD process; heating the substrate containing the upper aluminum oxide layer disposed on the chromium oxide layer to diffuse aluminum from the nickel-aluminum alloy in the substrate to an interface between the substrate and the chromium oxide layer during a first annealing process, wherein the interface comprises a greater concentration of aluminum after the first annealing process than before the first annealing process; and heating the substrate containing the upper aluminum oxide layer disposed on the chromium oxide layer during a second annealing process, further comprising: converting the aluminum in the interface between the substrate and the chromium oxide layer to a lower aluminum oxide layer comprising crystalline aluminum oxide; converting at least a portion of the amorphous chromium oxide in the chromium oxide layer to crystalline chromium oxide; and converting at least a portion of the amorphous aluminum oxide in the upper aluminum oxide layer to crystalline aluminum oxide.

5. The method according to any one of paragraphs 1-4, wherein the first annealing process comprises heating the substrate to a temperature of about 400° C. to less than 1,000° C. for about 0.5 hours to about 48 hours.

6. The method according to any one of paragraphs 1-5, wherein the first annealing process comprises heating the substrate to a temperature of about 450° C. to about 800° C. for about 0.8 hours to about 30 hours.

7. The method according to any one of paragraphs 1-6, wherein the chromium oxide layer is deposited to a thickness of about 10 nm to about 10,000 nm.

8. The method according to any one of paragraphs 1-7, wherein the chromium oxide layer is deposited to a thickness of about 100 nm to about 5,000 nm.

9. The method according to any one of paragraphs 1-8, wherein the substrate is exposed to an annealing gas during the first annealing process, and wherein the annealing gas comprises nitrogen ($N_2$), oxygen ($O_2$), a mixture of nitrogen and oxygen, nitrous oxide, nitric oxide, air, argon, helium, or any mixture thereof.

10. The method according to any one of paragraphs 1-9, wherein the aluminum oxide layer is deposited to a thickness of about 10 nm to about 10,000 nm.

11. The method according to any one of paragraphs 1-10, wherein the aluminum oxide layer is deposited to a thickness of about 100 nm to about 5,000 nm.

12. The method according to any one of paragraphs 1-11, wherein the aluminum oxide layer comprises a dopant aluminum oxide containing hafnium, zirconium, yttrium, or any combination thereof.

13. The method according to any one of paragraphs 1-12, wherein the aluminum oxide layer comprises a combination of aluminum oxide and one or more of hafnium oxide, a hafnium-doped aluminum oxide, hafnium aluminate, a combination of aluminum oxide and zirconium oxide, a zirconium-doped aluminum oxide, zirconium aluminate, a combination of aluminum oxide and yttrium oxide, a yttrium-doped aluminum oxide, yttrium aluminate, dopants thereof, or any combination thereof.

14. The method according to any one of paragraphs 1-13, wherein the aluminum oxide layer has a dopant concentration of about 0.01 at % to about 8 at %.

15. The method according to any one of paragraphs 1-14, wherein the second annealing process comprises heating the substrate to a temperature of about 400° C. to less than 1,000° C. for about 0.5 hours to about 48 hours.

16. The method according to any one of paragraphs 1-15, wherein the second annealing process comprises heating the substrate to a temperature of about 450° C. to about 950° C. for about 0.8 hours to about 30 hours.

17. The method according to any one of paragraphs 1-16, wherein the substrate is exposed to an annealing gas during the second annealing process.

18. The method according to any one of paragraphs 1-17, wherein the annealing gas comprises nitrogen ($N_2$), oxygen ($O_2$), a mixture of nitrogen and oxygen, nitrous oxide, nitric oxide, air, argon, helium, or any mixture thereof.

19. The method according to any one of paragraphs 1-18, wherein the chromium oxide layer comprising the amorphous chromium oxide is deposited by the first ALD process and the aluminum oxide layer comprising the amorphous aluminum oxide is deposited by the second ALD process.

20. The method according to any one of paragraphs 1-19, wherein each of the first oxidizing agent and the second oxidizing agent independently comprises water, ozone, oxygen ($O_2$), atomic oxygen, nitrous oxide, a peroxide, an alcohol, plasmas thereof, or any combination thereof.

21. The method according to any one of paragraphs 1-20, wherein the substrate comprises a silicon substrate, a silicon oxide substrate, a polymeric or plastic substrate, a nano-structured device, a surface or component within a processing chamber, a surface or component of a tool, or any combination thereof.

22. The method according to any one of paragraphs 1-21, wherein the substrate comprises an aerospace component.

23. The method according to any one of paragraphs 1-22, wherein the substrate and/or the aerospace component is a turbine blade, a turbine vane, a support member, a frame, a rib, a fin, a pin fin, a fuel nozzle, a combustor liner, a combustor shield, a heat exchanger, a fuel line, a fuel valve, an internal cooling channel, or any combination thereof.

24. The method according to paragraph 22, wherein the surface of the substrate is an interior surface of the aerospace component.

25. The method according to paragraph 24, wherein the interior surface has an aspect ratio of about 5 to about 1,000.

26. The method according to any one of paragraphs 1-25, wherein the substrate and/or the aerospace component comprises nickel, nickel superalloy, nickel-aluminum alloy, aluminum, iron, stainless steel, cobalt, chromium, molybdenum, titanium, alloys thereof, or any combination thereof.

27. A substrate and/or an aerospace component produced, made, or treated by the method according to any one of paragraphs 1-26.

While the foregoing is directed to embodiments of the disclosure, other and further embodiments may be devised without departing from the basic scope thereof, and the scope thereof is determined by the claims that follow. All documents described herein are incorporated by reference herein, including any priority documents and/or testing procedures to the extent they are not inconsistent with this text. As is apparent from the foregoing general description and the specific embodiments, while forms of the present disclosure have been illustrated and described, various modifications can be made without departing from the spirit and scope of the present disclosure. Accordingly, it is not intended that the present disclosure be limited thereby. Likewise, the term "comprising" is considered synonymous with the term "including" for purposes of United States law. Likewise whenever a composition, an element or a group of elements is preceded with the transitional phrase "comprising", it is understood that we also contemplate the same composition or group of elements with transitional phrases "consisting essentially of," "consisting of", "selected from the group of consisting of," or "is" preceding the recitation of the composition, element, or elements and vice versa.

Certain embodiments and features have been described using a set of numerical upper limits and a set of numerical lower limits. It should be appreciated that ranges including the combination of any two values, e.g., the combination of any lower value with any upper value, the combination of any two lower values, and/or the combination of any two upper values are contemplated unless otherwise indicated. Certain lower limits, upper limits and ranges appear in one or more claims below.

What is claimed is:

1. A method of forming a protective coating on a substrate, comprising:
   exposing the substrate to a chromium precursor and a first oxidizing agent to form a chromium oxide layer comprising amorphous chromium oxide on a surface of the substrate during a first atomic layer deposition (ALD) process or a first chemical vapor deposition (CVD) process;
   heating the substrate containing the chromium oxide layer comprising the amorphous chromium oxide to convert at least a portion of the amorphous chromium oxide to crystalline chromium oxide during a first annealing process; then
   exposing the substrate to an aluminum precursor and a second oxidizing agent to form an aluminum oxide layer comprising amorphous aluminum oxide on the chromium oxide layer during a second ALD process or a second CVD process; and
   heating the substrate containing the aluminum oxide layer disposed on the chromium oxide layer to convert at least a portion of the amorphous aluminum oxide to crystalline aluminum oxide during a second annealing process.

2. The method of claim 1, wherein the first annealing process comprises heating the substrate to a temperature of about 400° C. to less than 1,000° C. for about 0.5 hours to about 48 hours.

3. The method of claim 1, wherein the chromium oxide layer is deposited to a thickness of about 10 nm to about 10,000 nm.

4. The method of claim 1, wherein the substrate is exposed to an annealing gas during the first annealing process, and wherein the annealing gas comprises nitrogen ($N_2$), oxygen ($O_2$), a mixture of nitrogen and oxygen, nitrous oxide, nitric oxide, air, argon, helium, or any mixture thereof.

5. The method of claim 1, wherein the aluminum oxide layer is deposited to a thickness of about 10 nm to about 10,000 nm.

6. The method of claim 1, wherein the aluminum oxide layer comprises a dopant aluminum oxide containing hafnium, zirconium, yttrium, or any combination thereof.

7. The method of claim 6, wherein the aluminum oxide layer comprises a combination of aluminum oxide and one or more of hafnium oxide, a hafnium-doped aluminum oxide, hafnium aluminate, a combination of aluminum oxide and zirconium oxide, a zirconium-doped aluminum oxide, zirconium aluminate, a combination of aluminum oxide and yttrium oxide, a yttrium-doped aluminum oxide, yttrium aluminate, dopants thereof, or any combination thereof.

8. The method of claim 6, wherein the aluminum oxide layer has a dopant concentration of about 0.01 at % to about 8 at %.

9. The method of claim 1, wherein the second annealing process comprises heating the substrate to a temperature of about 400° C. to less than 1,000° C. for about 0.5 hours to about 48 hours.

10. The method of claim 1, wherein the second annealing process comprises heating the substrate to a temperature of about 450° C. to about 950° C. for about 0.8 hours to about 30 hours.

11. The method of claim 1, wherein the substrate is exposed to an annealing gas during the second annealing process, and wherein the annealing gas comprises nitrogen ($N_2$), oxygen ($O_2$), a mixture of nitrogen and oxygen, nitrous oxide, nitric oxide, air, argon, helium, or any mixture thereof.

12. The method of claim 1, wherein the chromium oxide layer comprising the amorphous chromium oxide is deposited by the first ALD process and the aluminum oxide layer comprising the amorphous aluminum oxide is deposited by the second ALD process.

13. The method of claim 12, wherein each of the first oxidizing agent and the second oxidizing agent independently comprises water, ozone, oxygen ($O_2$), atomic oxygen, nitrous oxide, a peroxide, an alcohol, plasmas thereof, or any combination thereof.

14. The method of claim 1, wherein the substrate comprises a silicon substrate, a silicon oxide substrate, a polymeric or plastic substrate, a nanostructured device, a surface or component within a processing chamber, a surface or component of a tool, or any combination thereof.

15. The method of claim 1, wherein the substrate comprises an aerospace component.

16. The method of claim 15, wherein the aerospace component is a turbine blade, a turbine vane, a support member, a frame, a rib, a fin, a pin fin, a fuel nozzle, a combustor liner, a combustor shield, a heat exchanger, a fuel line, a fuel valve, an internal cooling channel, or any combination thereof.

17. The method of claim 15, wherein the surface of the substrate is an interior surface of the aerospace component, and wherein the interior surface has an aspect ratio of about 5 to about 1,000.

18. The method of claim 15, wherein the aerospace component comprises nickel, nickel superalloy, nickel-aluminum alloy, aluminum, iron, stainless steel, cobalt, chromium, molybdenum, titanium, alloys thereof, or any combination thereof.

19. A method of forming a protective coating on a substrate, comprising:
   exposing the substrate to a chromium precursor and a first oxidizing agent to form a chromium oxide layer comprising amorphous chromium oxide on a surface of the substrate during a first vapor deposition process;
   exposing the substrate to an aluminum precursor and a second oxidizing agent to form an aluminum oxide layer comprising amorphous aluminum oxide on the chromium oxide layer during a second vapor deposition process; and
   heating the substrate containing the aluminum oxide layer disposed on the chromium oxide layer to convert the amorphous aluminum oxide to crystalline aluminum oxide;
   wherein the aluminum oxide layer comprising the crystalline aluminum oxide is disposed on the chromium oxide layer comprising crystalline chromium oxide.

20. A method of forming a protective coating on a substrate, comprising:

depositing a chromium oxide layer comprising amorphous chromium oxide on a surface of the substrate during a first atomic layer deposition (ALD) process or a first chemical vapor deposition (CVD) process, wherein the substrate comprises a nickel-aluminum alloy;

depositing an upper aluminum oxide layer comprising amorphous aluminum oxide on the chromium oxide layer during a second ALD process or a second CVD process;

heating the substrate containing the upper aluminum oxide layer disposed on the chromium oxide layer to diffuse aluminum from the nickel-aluminum alloy in the substrate to an interface between the substrate and the chromium oxide layer during a first annealing process, wherein the interface comprises a greater concentration of aluminum after the first annealing process than before the first annealing process; and heating the substrate containing the upper aluminum oxide layer disposed on the chromium oxide layer during a second annealing process, further comprising:
converting the aluminum in the interface between the substrate and the chromium oxide layer to a lower aluminum oxide layer comprising crystalline aluminum oxide;
converting at least a portion of the amorphous chromium oxide in the chromium oxide layer to crystalline chromium oxide; and
converting at least a portion of the amorphous aluminum oxide in the upper aluminum oxide layer to crystalline aluminum oxide.

21. A method of claim 19, wherein prior to the second vapor deposition process, further comprising heating the substrate containing the chromium oxide layer comprising the amorphous chromium oxide to convert at least a portion of the amorphous chromium oxide to the crystalline chromium oxide.

* * * * *